US011005035B2

(12) United States Patent
Suzuki et al.

(10) Patent No.: US 11,005,035 B2
(45) Date of Patent: May 11, 2021

(54) MAGNETORESISTIVE EFFECT ELEMENT

(71) Applicant: TDK CORPORATION, Tokyo (JP)

(72) Inventors: Tsuyoshi Suzuki, Tokyo (JP);
Katsuyuki Nakada, Tokyo (JP); Shinto Ichikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/364,905

(22) Filed: Mar. 26, 2019

(65) Prior Publication Data
US 2020/0212295 A1    Jul. 2, 2020

(30) Foreign Application Priority Data

Dec. 28, 2018    (JP) .............................. JP2018-247836

(51) Int. Cl.
*H01L 43/10*    (2006.01)
*H01L 43/02*    (2006.01)
*H01L 43/08*    (2006.01)

(52) U.S. Cl.
CPC .............. *H01L 43/10* (2013.01); *H01L 43/02* (2013.01); *H01L 43/08* (2013.01)

(58) Field of Classification Search
CPC ................................ H01L 43/08; H01L 27/222
See application file for complete search history.

(56) References Cited

U.S. PATENT DOCUMENTS

| 2012/0241881 | A1* | 9/2012 | Daibou | ................... | H01L 43/10 257/421 |
| 2013/0221461 | A1* | 8/2013 | Sukegawa | ............... | H01L 43/08 257/421 |
| 2018/0068681 | A1 | 3/2018 | Sasaki | | |
| 2018/0083186 | A1 | 3/2018 | Sasaki et al. | | |

(Continued)

FOREIGN PATENT DOCUMENTS

| WO | 2016/158849 A1 | 10/2016 |
| WO | 2016/158867 A1 | 10/2016 |

OTHER PUBLICATIONS

Sukegawa, Hiroaki et al. "Enhanced tunnel magnetoresistance in a spinel oxide barrier with cation-site disorder". Physical Review B 86, p. 184401-1-184401-5, 2012.

(Continued)

*Primary Examiner* — Caridad Everhart
*Assistant Examiner* — Ankush K Singal
(74) *Attorney, Agent, or Firm* — Oliff PLC

(57) ABSTRACT

A magnetoresistive effect element includes a first ferromagnetic layer and a tunnel barrier layer. The tunnel barrier layer has a main body region and a first interface region. The main body region has an oxide material of a first spinel structure represented by a general formula $LM_2O_4$. The first interface region has at least one element X selected from a group consisting of elements having a valence of 2 and elements having a valence of 3 excluding Al and has an oxide material of a second spinel structure represented by a general formula $DG_2O_4$ (D represents one or more kinds of elements includ- (Continued)

ing Mg or the element X, and G represents one or more kinds of elements including Al or the element X). A content of the element X contained in the first interface region is larger than that of the element X contained in the main body region.

21 Claims, 7 Drawing Sheets

(56) References Cited

U.S. PATENT DOCUMENTS

2018/0090670 A1* 3/2018 Sasaki .................. G11C 11/161
2019/0036016 A1    1/2019 Sasaki et al.
2020/0035913 A1* 1/2020 Ichikawa ............. G11B 5/3909

OTHER PUBLICATIONS

Sukegawa, Hiroaki et al. "Tunnel magnetoresistance with improved bias voltage dependence in lattice-matched Fe/spinel MgAl2O4/Fe(001) junctions". American Institute of Physics, Applied Physics Letters, 96, 2010, p. 212505-1-p. -212505-3.

* cited by examiner

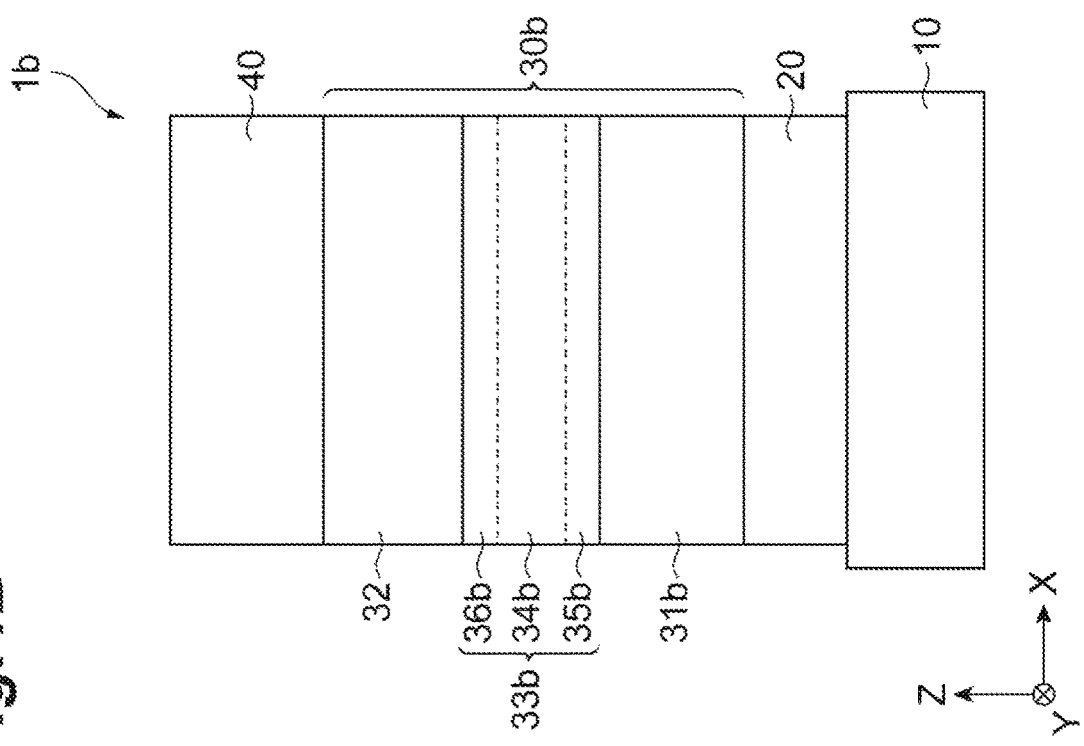
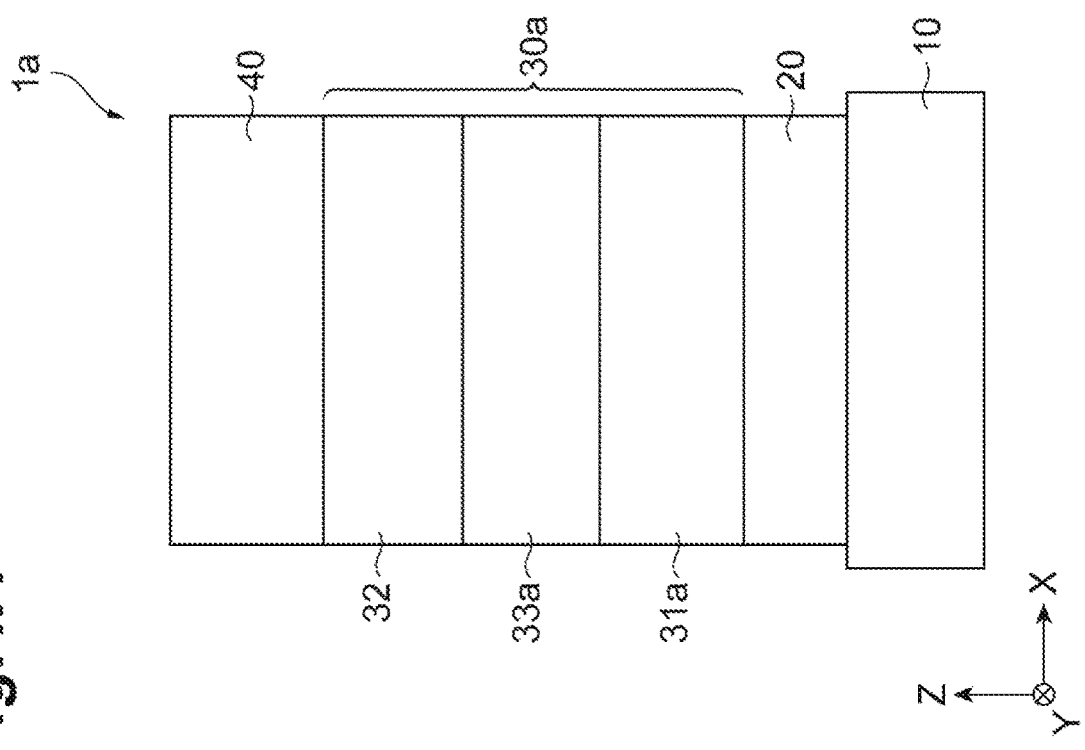

MAGNETORESISTIVE EFFECT ELEMENT

TECHNICAL FIELD

The present disclosure relates to a magnetoresistive effect element.

BACKGROUND

Non-Patent Literature 1 mentioned below discloses a magnetic tunnel junction (MTJ) element using a spinel barrier.
Non-Patent Document 1: H. Sukegawa et. al., "Enhanced tunnel magnetoresistance in a spinel oxide barrier with cation-site disorder", Phys. Rev. B86, 184401 (2012).

SUMMARY

An MTJ element generally includes a first ferromagnetic layer, a second ferromagnetic layer, and a tunnel barrier layer sandwiched between the two ferromagnetic layers. In the MTJ element, a difference between a resistance when a magnetization direction of the first ferromagnetic layer is parallel to a magnetization direction of the second ferromagnetic layer and a resistance when it is antiparallel thereto is used. An MTJ element having a large difference between the resistances can exhibit a large magnetoresistive (MR) ratio.

As a material constituting the tunnel barrier layer of an MTJ element, $MgAl_2O_4$ having a spinel structure or the like is known as a material which can exhibit a large MR ratio. However, also in an MTJ element having a tunnel barrier layer containing this material, for example, when a difference between a lattice constant of the tunnel barrier layer and a lattice constant of the first and second ferromagnetic layers is approximately doubled, the MR ratio may be reduced by a so-called band folding effect. When this effect occurs, a conductance in which the magnetization direction of the first ferromagnetic layer and the magnetization direction of the second ferromagnetic layer are anti-parallel to each other increases, and as a result, the MR ratio decreases.

In Non-Patent Literature 1, the lattice constant of the tunnel barrier layer is brought close to the lattice constant of the first and second ferromagnetic layers by disordered $MgAl_2O_4$ having a spinel structure, such that a band folding effect is suppressed and the MR ratio is increased. However, an increase in the MR ratio is still insufficient, and to obtain a larger magnetoresistive effect, it is necessary to proceed with improvement thereof by a method replacing the introduction of disordered spinel.

The present disclosure has been made in view of these circumstances, and it is an object thereof to provide a magnetoresistive effect element including a tunnel barrier layer having a spinel structure and having a large magnetoresistive effect.

A magnetoresistive effect element according to an aspect of the present disclosure includes a first ferromagnetic layer, a second ferromagnetic layer, and a tunnel barrier layer provided between the first ferromagnetic layer and the second ferromagnetic layer, wherein the tunnel barrier layer has a main body region and a first interface region, the main body region has an oxide material of a first spinel structure represented by a general formula $LM_2O_4$ (wherein L represents one or more kinds of elements including Mg, and M represents one or more kinds of elements including Al), the first interface region is provided between the main body region and the first ferromagnetic layer, the first interface region contains at least one kind of element X selected from a group consisting of elements having a valence of 2 and elements having a valence of 3 excluding Al and has an oxide material of a second spinel structure represented by a general formula $DG_2O_4$ (wherein D represents one or more kinds of elements including Mg or the element X, and G represents one or more kinds of elements including Al or the element X), and a content of the element X contained in the first interface region is larger than a content of the element X contained in the main body region.

According to the magnetoresistive effect element, the first interface region of the tunnel barrier layer has the second spinel structure represented by the general formula $DG_2O_4$, and the main body region has the oxide material of the first spinel structure represented by the general formula $LM_2O_4$. The inventors of the present disclosure have found that a band folding effect is suppressed when the first interface region contains the element X. Further, in the main body region of the tunnel barrier layer, since the content of the element X is smaller than that in the first interface region, a composition of $LM_2O_4$ of the first spinel structure can be easily maintained at or near $MgAl_2O_4$, and thus the main body region can sufficiently exert a function thereof as the tunnel barrier layer for realizing a large MR ratio. Accordingly, the magnetoresistive effect element can exhibit a large magnetoresistive effect.

In the magnetoresistive effect element according to the aspect of the present disclosure, the tunnel barrier layer may further have a second interface region, the second interface region may be provided between the main body region and the second ferromagnetic layer, the second interface region may contain the element X and have an oxide material of a third spinel structure represented by the general formula $DG_2O_4$, and a content of the element X contained in the second interface region may be larger than the content of the element X contained in the main body region.

According to the magnetoresistive effect element, the tunnel barrier layer has the second interface region in addition to the first interface region. The band folding effect can be suppressed also by the second interface region based on the same reason as that in the first interface region. This magnetoresistive effect element can exhibit a still larger magnetoresistive effect.

In the magnetoresistive effect element according to the aspect of the present disclosure, the element X may be an element belonging to Group 2 or 13.

According to the magnetoresistive effect element, since the element X may be an element belonging to the same Group 2 as Mg or an element belonging to the same Group 13 as Al, the interface region(s) of the tunnel barrier layer can easily have a stable structure.

In the magnetoresistive effect element according to the aspect of the present disclosure, the element X may include at least one of Mg, Ga and In.

According to the magnetoresistive effect element, since the element X includes at least one of Mg, Ga, and In, the interface region(s) of the tunnel barrier layer has a structure containing the element X of which a period of element is close to that of Al, and it is easy to have a more stable structure.

In the magnetoresistive effect element according to the aspect of the present disclosure, the element X may include Ga or In According to the magnetoresistive effect element, since the element X may include Ga or In of which a period of element is close to that of Al, and which is trivalent as Al and belongs to the same Group 13 as Al, the interface region(s)

of the tunnel barrier layer can have a more stable structure, and an area resistance value of the magnetoresistive effect element can be reduced.

In the magnetoresistive effect element according to the aspect of the present disclosure, at least one of the first ferromagnetic layer and the second ferromagnetic layer may contain at least one of Co and Fe.

According to the magnetoresistive effect element, since at least one of the first ferromagnetic layer and the second ferromagnetic layer may contain at least one of Co and Fe, it is possible to reduce a lattice mismatch rate between at least one of the first ferromagnetic layer and the second ferromagnetic layer and the tunnel barrier layer. As a result, a still larger magnetoresistive effect is realized.

In the magnetoresistive effect element according to the aspect of the present disclosure, at least a part of the oxide material of the second spinel structure of the first interface region may have a disordered spinel structure.

According to the magnetoresistive effect element, since at least a part of the oxide material of the second spinel structure of the first interface region may have a disordered spinel structure, a lattice constant of the first interface region can be close to a lattice constant of the first ferromagnetic layer. As a result, it is possible to further suppress the band folding effect, and thus it is possible to realize a larger magnetoresistive effect.

In the magnetoresistive effect element according to the aspect of the present disclosure, at least a part of the oxide material of the second spinel structure of the first interface region may have an ordered spinel structure, and at least a part of the element X may be arranged at a G site in the oxide material of the second spinel structure.

According to the magnetoresistive effect element, since the first interface region has a structure in which Al contained in an ordered spinel type spinel structure is substituted by the element X, at least the part of the element X easily comes into direct contact with the first ferromagnetic layer. As a result, the above-described band folding effect is further suppressed, and thus a still larger magnetoresistive effect is realized.

In the magnetoresistive effect element according to the aspect of the present disclosure, at least a part of the oxide material of the third spinel structure of the second interface region may have a disordered spinel structure.

According to the magnetoresistive effect element, since at least a part of the oxide material of the third spinel structure of the second interface region may have a disordered spinel structure, a lattice constant of the second interface region can be close to a lattice constant of the second ferromagnetic layer. As a result, it is possible to further suppress the band folding effect, and thus it is possible to realize a still larger magnetoresistive effect.

In the magnetoresistive effect element according to the aspect of the present disclosure, at least a part of the oxide material of the third spinel structure of the second interface region may have an ordered spinel structure, and at least a part of the element X may be arranged at a G site in the oxide material of the third spinel structure.

According to the magnetoresistive effect element, since the second interface region has a structure in which Al contained in an ordered spinel type spinel structure is substituted by the element X, at least the part of the element X easily comes into direct contact with the second ferromagnetic layer. As a result, the above-described band folding effect is further suppressed, and thus a still larger magnetoresistive effect is realized.

According to the present disclosure, it is possible to provide a magnetoresistive effect element including a tunnel barrier layer having a spinel structure and having a large magnetoresistive effect.

BRIEF DESCRIPTION OF THE DRAWINGS

FIG. 4A is a diagram showing a cross section of a magnetoresistive effect element according to Comparative example 1.

FIG. 4B is a diagram showing a cross section of a magnetoresistive effect element according to Comparative example 2.

DETAILED DESCRIPTION

Figure 1:
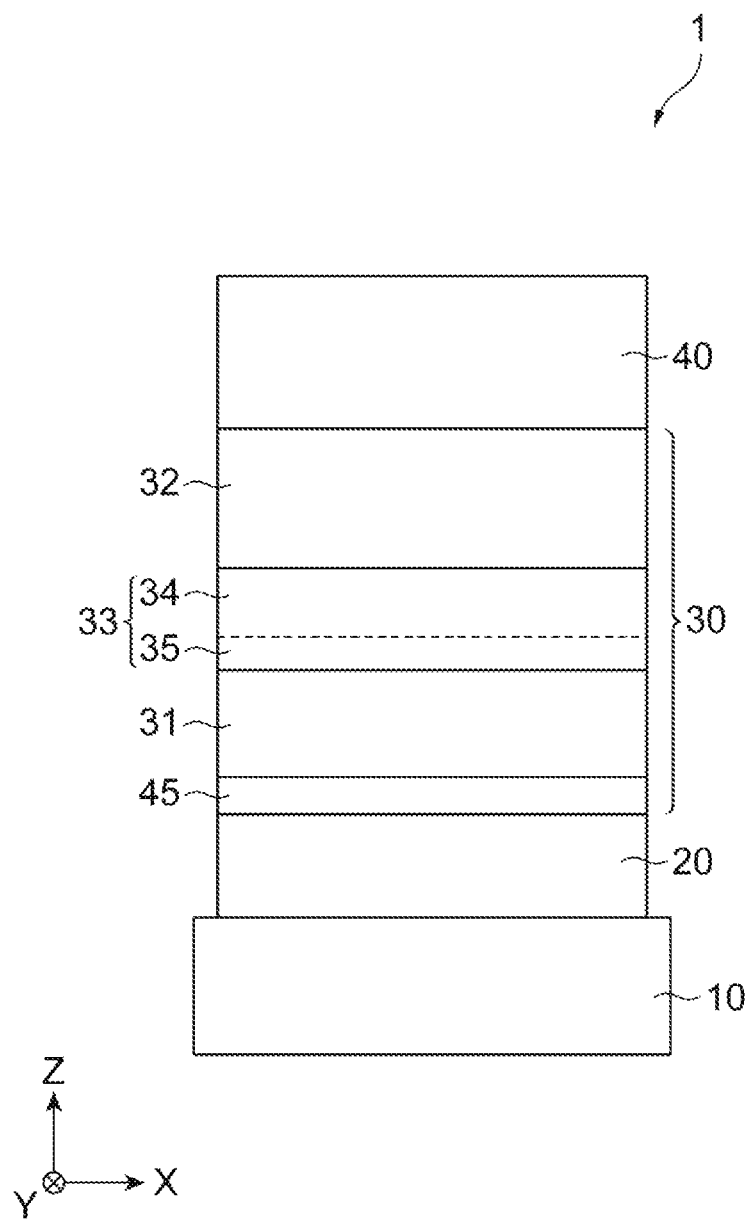
FIG. 1 is a diagram showing a cross section of a magnetoresistive effect element according to a first embodiment.

Hereinafter, embodiments of the present disclosure will be described in detail with reference to the accompanying drawings. In each drawing, the same reference numerals are used for the same elements when possible. Further, dimensional ratios in the constituent elements and between the constituent elements in the drawings are respectively arbitrary for ease of viewing of the drawings. In the embodiment, although an X axis, a Y axis, and a Z axis are set with respect to FIGS. 1, 2, and 4, these axes are set for the sake of convenience, and the Z axis is set in a stacking direction of a magnetoresistive effect element.

FIG. 1 is a diagram showing a cross section of a magnetoresistive effect element according to a first embodiment. The magnetoresistive effect element 1 includes, for example, a substrate 10, a base layer 20, a spin valve layer 30, and a cap layer 40 in this order.

The substrate 10 may include, for example, a silicon single crystal, a metal oxide single crystal, a silicon single crystal with a thermal oxide film, a sapphire single crystal, a ceramic, quartz, and glass. The material contained in the substrate 10 is not particularly limited as long as it has appropriate mechanical strength and is suitable for an annealing treatment and fine processing. For example, an MgO single crystal may be used as a metal oxide single crystal, and according to a substrate containing an MgO single crystal, for example, an epitaxial growth film is easily formed using a sputtering method.

The base layer 20 is provided for improving the crystallizability of the spin valve layer 30 and may be an electrode for measuring magnetoresistive characteristics of the magnetoresistive effect element 1. The base layer 20 contains at least one metal element from, for example, Al, Ag, Au, Cu, Cr, Pt, Ru, Ta, V, Rh, Pd, Ir, Mo and W and may include an alloy of these metal elements or a stacked body of materials consisting of two or more kinds of these metal element. Examples of alloys of these metal elements include a cubic AgZn alloy, an AgMg alloy, a NiTa alloy and a NiAl alloy. The stacked body of the material consisting of two or more metal elements includes, for example, a stacked body of materials containing Ta and Ru. A crystal orientation layer for controlling crystal orientations of upper layers may be provided between the base layer 20 and the substrate 10, if necessary. As a first example of the crystal orientation layer, a layer of a nitride having an (001)-oriented NaCl structure and containing at least one element selected from a group consisting of Ti, Zr, Nb, V, Hf, Ta, Mo, W, B, Al and Ce can be used. As a second example of the crystal orientation layer, a layer of an (002)-oriented perovskite-based conductive oxide formed of $ABO_3$ can be used. Here, a site A contains at least one element selected from a group consisting of Sr, Ce, Dy, La, K, Ca, Na, Pb and Ba, and the site B contains at least one element selected from a group of Ti, V, Cr, Mn, Fe, Co, Ni, Ga, Nb, Mo, Ru, Ir, Ta, Ce and Pb. As a third example of the crystal orientation layer, a layer of an oxide having an (001)-oriented NaCl structure and containing at least one element selected from a group consisting of Mg, Al, and Ce can be used.

The spin valve layer 30 includes a first ferromagnetic layer 31, a second ferromagnetic layer 32, a tunnel barrier layer 33, and an antiferromagnetic layer 45. The tunnel barrier layer 33 is provided between the first ferromagnetic layer 31 and the second ferromagnetic layer 32. The antiferromagnetic layer 45 is provided on the first ferromagnetic layer 31 on a side opposite to the tunnel barrier layer 33. The first ferromagnetic layer 31 may be provided, for example, on the base layer 20, and the first ferromagnetic layer 31, the tunnel barrier layer 33, and the second ferromagnetic layer 32 may be arranged in this order. The first ferromagnetic layer 31 and the antiferromagnetic layer 45 jointly serve as a magnetization fixed layer, and the second ferromagnetic layer 32 serves as a magnetization free layer.

It is difficult for a magnetization direction of the first ferromagnetic layer 31 serving as the magnetization fixed layer to change with respect to an external magnetic field as compared with a magnetization direction of the second ferromagnetic layer 32 serving as the magnetization free layer. It is preferable that the magnetization direction of the first ferromagnetic layer 31 be substantially fixed with respect to an external magnetic field and not substantially change with respect to the external magnetic field. In the embodiment, such a state of the magnetization direction of the first ferromagnetic layer 31 is realized by exchange-coupling the antiferromagnetic layer 45 with the first ferromagnetic layer 31 and imparting unidirectional magnetic anisotropy to the first ferromagnetic layer 31. Since this state of the magnetization direction can be realized without using the antiferromagnetic layer 45, the spin valve layer 30 may not have the antiferromagnetic layer 45. On the other hand, the second ferromagnetic layer 32 serving as the magnetization free layer is formed of, for example, a soft magnetic material, and the magnetization direction thereof is not substantially fixed. Therefore, when an external magnetic field is applied to the spin valve layer 30, the magnetization direction easily changes in that direction. When an external magnetic field is applied to the spin valve layer 30 and the relative magnetization directions of the first ferromagnetic layer 31 and the second ferromagnetic layer 32 are changed, a resistance value of the spin valve layer 30 changes, and thus the magnetoresistive effect element 1 exerts a magnetoresistive effect.

The first ferromagnetic layer 31 is composed of a ferromagnetic material. For example, a metal or an alloy having at least one element selected from Ni, Fe, Ru, Mn, Ir, Cr and Co may be used as a ferromagnetic material for the magnetization fixed layer. Specific examples of the alloy include a Co—Fe alloy, a Ni—Fe alloy, a Co—B alloy, an Fe—B alloy, a Co—Fe—B alloy and so on. A Heusler alloy such as a Co—Fe—Al alloy, a Co—Fe—Si alloy, a Co—Mn—Si alloy, a Co—Mn—Ge alloy, a Co—Fe—Al—Si alloy, and a Co—Fe—Ga—Ge alloy may also be used as the ferromagnetic material. The first ferromagnetic layer 31 may have, for example, a structure in which a multilayer film formed of a Co—Fe alloy, a Co—Fe—B alloy or the like is repeatedly stacked. Further, when the magnetization direction of the first ferromagnetic layer 31 is perpendicular to a stacking surface, a stacked film of Co and Pt may be used as the first ferromagnetic layer 31.

The antiferromagnetic layer 45 is formed of, for example, an antiferromagnetic material such as an FeMn alloy, a PtMn alloy, a PtCrMn alloy, a NiMn alloy, a IrMn alloy, NiO, $Fe_2O_3$ or the like.

A thickness of the first ferromagnetic layer 31 in the stacking direction (the Z-axis direction) is, for example, in a range of 0.5 nm or more and 100 nm or less. Also, this thickness is, for example, in a range of 0.8 nm or more and 50 nm or less.

The second ferromagnetic layer 32 serving as the magnetization free layer is composed of a ferromagnetic material having soft magnetic properties such as Fe, Co—Fe, Ni—Fe, Co—Fe—B and a ferromagnetic Heusler alloy.

A thickness of the second ferromagnetic layer 32 in the stacking direction (the Z-axis direction) is, for example, in a range of 0.5 nm or more and 100 nm or less. Also, this thickness is, for example, in a range of 0.8 nm or more and 8 nm or less.

A thickness of the antiferromagnetic layer 45 in the stacking direction (Z-axis direction) is, for example, in a range of 5 nm or more and 20 nm or less.

The magnetization fixed layer of this embodiment may have a structure called a synthesized anti-ferromagnetic structure (SAF structure). In this case, the spin valve layer 30 further includes a third ferromagnetic layer provided between the antiferromagnetic layer 45 and the first ferromagnetic layer 31, and a magnetic coupling layer provided between the first ferromagnetic layer 31 and the third ferromagnetic layer in addition to the first ferromagnetic layer 31 and the antiferromagnetic layer 45 as the magnetization fixed layers. The first ferromagnetic layer 31 and the third ferromagnetic layer are antiferromagnetically coupled by an exchange coupling magnetic field via the magnetic coupling layer. The third ferromagnetic layer may have the same configuration as that of the first ferromagnetic layer 31. The magnetic coupling layer is composed of a nonmagnetic metal such as Ru, Rh, Ir, or the like, and a thickness thereof in the stacking direction (the Z-axis direction) is, for example, in a range of 0.5 nm or more and 10 nm or less.

In the spin valve layer 30, one of the first ferromagnetic layer 31 and the second ferromagnetic layer 32 serves as a magnetization free layer, and the other one serves as a magnetization fixed layer. Therefore, as a modified example of the embodiment, the first ferromagnetic layer 31 may serve as a magnetization free layer, and the second ferromagnetic layer 32 may serve as a magnetization fixed layer. In this case, the antiferromagnetic layer 45 is provided on the second ferromagnetic layer 32 on a side opposite to the tunnel barrier layer 33 and imparts unidirectional magnetic anisotropy to the second ferromagnetic layer 32.

The tunnel barrier layer 33 has a main body region 34 and a first interface region 35. The first interface region 35 is provided between the main body region 34 and the first ferromagnetic layer 31 and is in direct contact with the first ferromagnetic layer 31. Instead of providing the first interface region 35 between the main body region 34 and the first ferromagnetic layer 31, the first interface region 35 may be provided between the main body region 34 and the second ferromagnetic layer 32.

The main body region 34 is composed of an insulating material and includes an oxide material having a first spinel structure represented by a general formula $LM_2O_4$. In $LM_2O_4$, L represents one or more kinds of elements including Mg. For example, L represents one or more kinds of elements including Mg, Zn, Cu, Cd, Li, Ni, Fe, Co, Mn, Cr, Hg and V. M represents one or more kinds of elements including Al. For example, M represents one or more kinds of elements including Al, Mg, Ga, In, Sc, Ti, V, Cr, Mn, Fe, Rh, Ir and Co. Further, L or M, or both L and M may include an element X which will be described later. Also, in $LM_2O_4$, O represents oxygen. Incidentally, a composition ratio of L, M and O is not necessarily a stoichiometric composition ratio L:M:O=1:2:4 and may be $L_{1-\alpha}M_\alpha O_\beta$ (a range of a is $0<\alpha\leq 1$, and a range of $\beta$ is $0.35\leq\beta\leq 1.7$).

The first spinel structure may be a normal spinel structure or an inverse spinel structure. For example, in the spinel structure represented by the general formula $LM_2O_4$, with regard to an element A included at an L site and an element B included at an M site, in the normal spinel structure, the element A is arranged at the L site and the element B is arranged at the M site, whereas in the inverse spinel structure, the element B is arranged at the L site and the same degree of number of atoms of elements A and B are arranged at M sites.

In the main body region 34, the oxide material having the first spinel structure may be $MgAl_2O_4$. At this time, the main body region 34 can sufficiently exert a function thereof as the tunnel barrier layer for achieving a large MR ratio.

The first interface region 35 contains at least one element X selected from a group consisting of elements having a valence of 2 and elements having a valence of 3 excluding Al and has a second spinel structure represented by a general formula $DG_2O_4$. In $DG_2O_4$, D represents one or more kinds of elements including Mg or an element X, and G represents one or more kinds of elements including Al or the element X. The element X is an element such as Mg, Ca, Mn, Fe, Co, Ni, Cu, Cd, Cr, Hg, Sc, Rh, Zn, B, Ga and In. Incidentally, a composition ratio of D, G and O is not necessarily a stoichiometric composition ratio D:G:O=1:2:4 and may be $D_{1-\eta}G_\eta O_\theta$ (a range of 1 is $0<\eta\leq 1$, and a range of $\theta$ is $0.35\leq\theta\leq 1.7$). The second spinel structure may be a normal spinel structure or an inverse spinel structure.

In the second spinel structure represented by the general formula $DG_2O_4$, although the first interface region 35 may contain the element X at a D site and a G site, the first interface region 35 may contain the element X in another mode in addition to, or instead of such a mode of containing the element X. For example, the first interface region 35 may contain the element X according to a mode such as interstitial impurities, substitution into a partially deficient O site, or the like.

In the tunnel barrier layer 33, the main body region 34 may contain the element X at an L site and an M site. Also, the main body region 34 may contain the element X according to the same mode as that of the first interface region 35 in addition to, or instead of such a mode of containing the element X.

In the main body region 34, the oxide material having the first spinel structure may be one in which the element X substitutes a part of elemental Al or Mg with respect to $MgAl_2O_4$, or may be one in which the element X is added to $MgAl_2O_4$ in a mode such as interlattice impurities, substitution into a partially deficient O site, or the like. At this case, since the main body region 34 is an oxide material based on $MgAl_2O_4$, it can sufficiently exert a function thereof as the tunnel barrier layer for realizing a large MR ratio. However, the main body region 34 preferably substantially contains no element X from the viewpoint of realizing a large MR ratio.

A content of the element X contained in the first interface region 35 is larger than a content of the element X contained in the main body region 34. In the embodiment, the content of the element X contained in the first interface region 35, for example, a content of In, is 5 at. % or more and 74 at. % or less. A content of In in the main body region 34 is, for example, 0 at. % or more and 37 at. % or less. Further, a content of another element X contained in the first interface region 35, for example, a content of Ga, is 5 at. % or more and 74 at. % or less. A content of Ga in the main body region 34 is, for example, 0 at. % or more and 37 at. % or less. Also, a content of another element X contained in the first interface region 35, for example, a content of Mg, is 10 at. % or more and 74 at. % or less. The content of Mg contained in the main body region 34 is, for example, 5 at. % or more and 50 at. % or less. More preferably, the content of the element X contained in the first interface region 35 is 110% or more of the content of the element X contained in the main body region 34.

In the embodiment, a content of Al contained in the first interface region 35 is 0 at. % or more and 74 at. % or less. A content of Al contained in the main body region 34 is 5 at. % or more and 74 at. % or less.

The magnetoresistive effect element 1 may include the cap layer 40 on the spin valve layer 30. The cap layer 40 is provided to protect the spin valve layer 30. The cap layer 40 may include one or more metal elements of Ru, Ag, Al, Cu, Au, Cr, Mo, Pt, W, Ta, Pd, and Ir, an alloy of these metal elements, or a stacked body of materials consisting of two or more kinds of these metal elements. If necessary, an upper electrode for allowing a current to flow through the magnetoresistive effect element 1 in the stacking direction may be provided on the cap layer 40.

The magnetoresistive effect element 1 is produced by forming each layer from the base layer 20 to the cap layer 40 on the substrate 10, for example, using a manufacturing method such as a sputtering method and an electron beam evaporation method. At the time of forming each layer, an annealing treatment may be performed if necessary, and also a magnetic field applying treatment for imparting unidirectional magnetic anisotropy may be performed if necessary. An appropriate heat treatment may be performed at the same time when the magnetic field applying treatment is performed. Further, the magnetoresistive effect element 1 may be microfabricated into a form in which the magnetoresistive characteristics can be evaluated by lithography using an electron beam or the like and dry etching using Ar ions or the like. The magnetoresistive effect element 1 is, for example, a magnetoresistive effect element having a current perpendicular to plane (CPP) structure in which a detection current flows in the stacking direction (a direction perpendicular to a film surface of each layer).

According to the above-described magnetoresistive effect element 1, the first interface region 35 of the tunnel barrier layer 33 has the second spinel structure represented by the general formula $DG_2O_4$, and the main body region 34 has an oxide material of the first spinel structure represented by the general formula $LM_2O_4$. The inventors of the present disclosure have found that the band folding effect is suppressed when the first interface region 35 contains the element X. Further, in the main body region 34 of the tunnel barrier layer 33, since the content of the element X is smaller than that in the first interface region 35, a composition of $LM_2O_4$ of the first spinel structure is easily maintained at or near $MgAl_2O_4$, and thus the main body region 34 can sufficiently exert its function as the tunnel barrier layer for realizing a large MR ratio. Therefore, the magnetoresistive effect element 1 can exhibit a large magnetoresistive effect.

The material of the first ferromagnetic layer 31 may be Co, Fe, a CoFe alloy, a CoFeB alloy, an FeAl alloy or the like. In this case, if the first ferromagnetic layer 31 is stacked with a tunnel barrier layer composed of an oxide material having a spinel structure not containing the element X, in particular, a tunnel barrier layer formed of $MgAl_2O_4$, the above-described band folding effect tends to occur. Therefore, when the material of the first ferromagnetic layer 31 is any one of the above-described materials, the band folding effect can be suppressed by interposing the first interface region 35 between the main body region 34 and the first ferromagnetic layer 31, and thus the above-described effect of the magnetoresistive effect element 1 of the embodiment which realizes a large MR ratio is particularly effectively exhibited.

In the magnetoresistive effect element 1, the element X may be an element belonging to the group 2 or 13 in the periodic table. Specifically, the element X may be an element having a valence of 2 or 3 such as Mg, Ca, B, Ga, and In.

According to the magnetoresistive effect element 1, since the element X may be an element belonging to the same group 2 as Mg or an element belonging to the same group 13 as Al, the first interface region 35 of the tunnel barrier layer 33 easily has a stable structure.

Also, in the magnetoresistive effect element 1, the element X may include at least one of Mg, Ga, and In. In this case, the first interface region 35 of the tunnel barrier layer 33 has a structure containing an element X of which a period of element is close to that of Al, and it is easy to have a more stable structure.

Further, in the magnetoresistive effect element 1, the element X may include Ga or In. According to the magnetoresistive effect element 1, since the element X can include Ga or In of which a period of element is close to that of Al, and which is trivalent as Al and belongs to the same group 13 as Al, the first interface region 35 of the tunnel barrier layer 33 can have a more stable structure, and an area resistance value of the magnetoresistive effect element 1 can be reduced.

Further, in the present embodiment, it is preferable that at least one of the first ferromagnetic layer 31 and the second ferromagnetic layer 32 contains at least one of Co and Fe. In this case, it is possible to reduce a lattice mismatch rate between at least one of the first ferromagnetic layer 31 and the second ferromagnetic layer 32 and the tunnel barrier layer 33.

In the embodiment, a thickness of the tunnel barrier layer 33 in the stacking direction (the Z-axis direction) can be, for example, in a range of 0.25 nm or more and 5 nm or less. Further, this thickness can be, for example, in a range of 0.7 nm or more and 3.0 nm or less.

In the tunnel barrier layer 33, a thickness of the main body region 34 in the stacking direction (the Z-axis direction) is, for example, in a range of 0.15 nm or more and 4.9 nm or less. Further, this thickness is, for example, in a range of 0.6 nm or more and 1.4 nm or less.

A thickness of the first interface region 35 in the stacking direction (the Z-axis direction) is, for example, in a range of 0.05 nm or more and 0.5 nm or less. Further, this thickness is, for example, in a range of 0.1 nm or more and 0.3 nm or less.

In the embodiment, the thickness of the first interface region 35 is, for example, 1% or more and 40% or less of the thickness of the entire tunnel barrier layer 33.

The oxide material having the second spinel structure in the first interface region 35 may have an ordered spinel structure as a whole or may have a disordered spinel structure as a whole or in part. In the latter case, since a lattice constant of the first interface region 35 can be close to a lattice constant of the first ferromagnetic layer 31, it is possible to further suppress the band folding effect, and thus it is possible to realize a larger magnetoresistive effect. In the spinel structure, the ordered spinel structure is a structure in which two types of cations are regularly arranged, and the disordered spinel structure is a crystal structure in which constituent elements are the same as those of the oxide material having the ordered spinel structure but two types of cations in the spinel structure are arranged irregularly.

The oxide material having the first spinel structure in the main body region 34 may have the ordered spinel structure as a whole or may have a disordered spinel structure in whole or in part.

In the magnetoresistive effect element 1, when at least a part of the oxide material having the second spinel structure in the first interface region 35 has the ordered spinel structure, at least a part of the element X may be arranged at G sites in the oxide material having the second spinel structure. For example, the first interface region 35 may have a structure in which Al contained in the G site of the ordered spinel type spinel structure is replaced by the element X. In the second spinel structure of the first interface region 35, from the viewpoint of energy, atoms of the G site in the general formula $DG_2O_4$ are more likely to come to the interface than atoms of the D site. Therefore, when at least a part of the element X is arranged at the G site, at least the part of the element X easily comes into direct contact with the first ferromagnetic layer 31. As a result, the above-described band folding effect is further suppressed, and thus a still larger magnetoresistive effect is realized.

Figure 2:
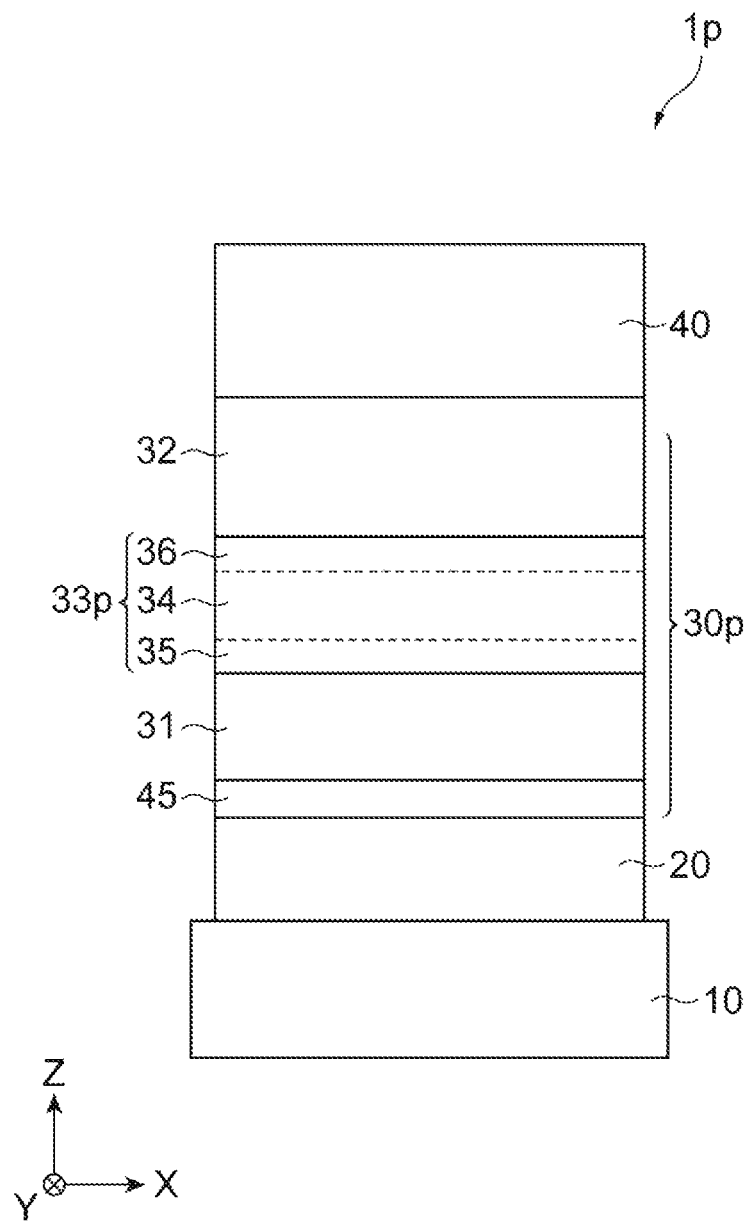
FIG. 2 is a diagram showing a cross section of a magnetoresistive effect element according to a second embodiment.

FIG. 2 is a diagram showing a cross section of a magnetoresistive effect element according to a second embodiment. The magnetoresistive effect element 1p includes, for example, a substrate 10, a base layer 20, a spin valve layer 30p and a cap layer 40 in this order. The magnetoresistive effect element 1p of the embodiment is different from the magnetoresistive effect element 1 of the first embodiment in the configuration of the tunnel barrier layer. Specifically, the magnetoresistive effect element 1p of the embodiment includes a spin valve layer 30p different from the spin valve layer 30 of the magnetoresistive effect element 1 of the first embodiment, and a tunnel barrier layer 33p of the spin valve layer 30p of the embodiment is different from the tunnel barrier layer 33 of the first embodiment in that it further includes a second interface region 36. The second interface region 36 is provided between the main body region 34 and the second ferromagnetic layer 32 and is in direct contact with the second ferromagnetic layer 32.

The magnetoresistive effect element 1p may include the same substrate 10, base layer 20 and cap layer 40 as those of the magnetoresistive effect element 1. Like the magnetoresistive effect element 1, the magnetoresistive effect element 1p is produced by forming each layer from the base layer 20 to the cap layer 40 on the substrate 10, for example, using a manufacturing method such as a sputtering method and an electron beam evaporation method.

As shown in FIG. 2, in the spin valve layer 30p, the antiferromagnetic layer 45, the first ferromagnetic layer 31, the first interface region 35, the main body region 34, the second interface region 36, and the second ferromagnetic layer 32 are stacked in this order. Also in the present embodiment, as in the case of the first embodiment, the magnetization fixed layer may have an SAF structure.

As a modified example of the embodiment, as in the above-described modified example of the first embodiment, the first ferromagnetic layer 31 may serve as the magnetization free layer and the second ferromagnetic layer 32 may serve as the magnetization fixed layer. In this case, the antiferromagnetic layer 45 is provided on the second ferromagnetic layer 32 on a side opposite to the tunnel barrier layer 33 and imparts unidirectional magnetic anisotropy to the second ferromagnetic layer 32.

The second interface region 36 contains the element X and a third spinel structure represented by the general formula $DG_2O_4$. In $DG_2O_4$ of the second interface region 36, D represents one or more kinds of elements including Mg or the element X, and G represents one or more kinds of elements including Al or the element X. The element X is an element such as Mg, Ca, Mn, Fe, Co, Ni, Cu, Cd, Cr, Hg, Sc, Rh, Zn, B, Ga and In. Incidentally, a composition ratio of D, G and O is not necessarily a stoichiometric composition ratio D:G:O=1:2:4 and may be $D_{1-\delta}G_\delta O_\varphi$ (a range of $\delta$ is $0<\delta\leq1$, and a range of $\varphi$ is $0.35\leq\varphi\leq1.7$). The third spinel structure can be a normal spinel structure or an inverse spinel structure.

In the third spinel structure represented by the general formula $DG_2O_4$, although the second interface region 36 may contain the element X at the D site and the G site, the second interface region 36 may contain the element X in another mode in addition to, or instead of such a mode of containing the element X. For example, the second interface region 36 may contain the element X according to a mode such as interstitial impurities, substitution into a partially deficient O site, or the like.

A content of the element X contained in the second interface region 36 is larger than a content of the element X contained in the main body region 34. In the embodiment, the content of the element X contained in the second interface region 36, for example, a content of In is 5 at. % or more and 74 at. % or less. A content of In contained in the main body region 34 is, for example, 0 at. % or more and 37 at. % or less. Further, a content of another element X contained in the second interface region 36, for example, a content of Ga is 5 at. % or more and 74 at. % or less. A content of Ga contained in the main body region 34 is, for example, 0 at. % or more and 37 at. % or less. Also, a content of another element X contained in the second interface region 36, for example, a content of Mg is 10 at. % or more and 74 at. % or less. A content of Mg contained in the main body region 34 is, for example, 5 at. % or more and 50 at. % or less. More preferably, the content of the element X contained in the second interface region 36 is 110% or more of the content of the element X contained in the main body region 34.

In the embodiment, a content of Al contained in the second interface region 36 is 0 at. % or more and 74 at. % or less. The content of Al contained in the main body region 34 is 5 at. % or more and 74 at. % or less.

According to the magnetoresistive effect element 1p, the tunnel barrier layer 33p has the second interface region 36 in addition to the first interface region 35. Since the band folding effect can be suppressed also by the second interface region 36 based on the same reason as that in the first interface region 35, this magnetoresistive effect element 1p can exhibit a still larger magnetoresistive effect.

In the magnetoresistive effect element 1p, the element X may be an element belonging to the group 2 or 13 in the periodic table. Specifically, the element X can be an element having a valence of 2 or 3 such as Mg, Ca, B, Ga, and In.

According to the magnetoresistive effect element 1p, since the element X may be an element belonging to the same group 2 as Mg or an element belonging to the same group 13 as Al, the second interface region 36 of the tunnel barrier layer 33p easily has a stable structure.

Also, in the magnetoresistive effect element 1p, the element X may include at least one of Mg, Ga, and In. In this case, the second interface region 36 of the tunnel barrier layer 33p has a structure containing an element X of which a period of element is close to that of Al, and it is easy to have a more stable structure.

Further, in the magnetoresistive effect element 1p, the element X may include Ga or In. According to the magnetoresistive effect element 1p, since the element X can include Ga or In of which a period of element is close to that of Al, and which is trivalent as Al and belongs to the same group 13 as Al, the second interface region 36 of the tunnel barrier layer 33p can have a more stable structure, and an area resistance value of the magnetoresistive effect element 1p can be reduced.

In the embodiment, a thickness of the tunnel barrier layer 33p in the stacking direction (the Z-axis direction) can be, for example, in a range of 0.25 nm or more and 5.0 nm or less. Further, this thickness can be, for example, in a range of 0.7 nm or more and 3.0 nm or less.

In the tunnel barrier layer 33p, a thickness of the main body region 34 in the stacking direction (the Z-axis direction) is, for example, in a range of 0.15 nm or more and 4.9 nm or less. Further, this thickness is, for example, in a range of 0.6 nm or more and 1.4 nm or less.

A thickness of the second interface region 36 in the stacking direction (the Z-axis direction) is, for example, in a range of 0.05 nm or more and 0.5 nm or less. Further, this thickness is, for example, in a range of 0.1 nm or more and 0.3 nm or less.

In the embodiment, the thickness of the second interface region 36 is, for example, 1% or more and 40% or less of the thickness of the entire tunnel barrier layer 33p.

In the magnetoresistive effect element 1p, the oxide material having the second spinel structure in the second interface region 36 may have an ordered spinel structure as a whole or may have a disordered spinel structure in whole or in part. In the latter case, since a lattice constant of the second interface region 36 can be close to a lattice constant of the second ferromagnetic layer 32, it is possible to further suppress the band folding effect and to realize a still larger magnetoresistive effect.

In the magnetoresistive effect element 1p, when at least a part of the oxide material having the third spinel structure in the second interface region 36 has the ordered spinel structure, at least a part of the element X may be arranged at the G site in the oxide material having the third spinel structure. For example, the second interface region 36 may have a structure in which Al contained in the G site of the ordered spinel type spinel structure is replaced by the element X. In the third spinel structure of the second interface region 36, from the viewpoint of energy, atoms of the G site in the general formula $DG_2O_4$ are more likely to come to the interface than atoms of the D site. Therefore, when at least a part of the element X is arranged at the G site, at least the part of the element X easily comes into direct contact with the second ferromagnetic layer 32. As a result, the above-described band folding effect is further suppressed, and thus a still larger magnetoresistive effect is realized.

EXAMPLES

Hereinafter, the magnetoresistive effect element will be further described by Examples and Comparative examples of the present disclosure, but the present disclosure is not limited to the following examples.

Example 1

As Example 1, a magnetoresistive effect element having the same configuration as that of the magnetoresistive effect element 1p of the second embodiment shown in FIG. 2 was produced. In the description relating to Example 1, the reference numerals used for the explanation of the magnetoresistive effect element 1p are cited. Incidentally, also in Examples 2 to 4, the same applies.

In Example 1, a magnetoresistive effect element 1p was produced by the following procedure. A temperature at the time of formation of each layer was set to the room temperature except for a case in which the temperature is specified (this also applies to Examples and Comparative Examples after Example 2). First, a buffer layer as the base layer 20 was formed on the substrate 10. Si with a thermally oxidized film was used as the substrate 10, and the buffer layer was formed on the substrate 10 by a sputtering method. The buffer layer was a stacked body consisting of a Ta layer (having a thickness of 5 nm) and a Ru layer (having a thickness of 3 nm).

Subsequently, a spin valve layer 30p was formed by a sputtering method. The spin valve layer 30p has a magnetization fixed layer of an SAF structure, the tunnel barrier layer 33p, and the second ferromagnetic layer 32 as a magnetization free layer in this order. In a process of forming the spin valve layer 30p, first, the magnetization fixed layer was formed. The magnetization fixed layer was a multilayer stacked body consisting of an IrMn layer (having a thickness of 5 nm) as the antiferromagnetic layer 45, a CoFe layer (having a thickness of 10 nm) as the third ferromagnetic layer (not shown), a Ru layer (having a thickness of 0.8 nm) as the magnetic coupling layer (not shown), and a two-layer stacked body as the first ferromagnetic layer 31 consisting of a CoFeB layer (having a thickness of 5 nm) and a CoFe layer (having a thickness of 1 nm).

Subsequently, a tunnel barrier layer 33p was formed on the first ferromagnetic layer 31. The tunnel barrier layer 33p has the first interface region 35, the main body region 34, and the second interface region 36. A process of forming the tunnel barrier layer 33p began with the formation of the first interface region 35. Specifically, an $In_2O_3$ layer (having a thickness of 0.15 nm) for supplying a part of the elements of the first interface region 35 was formed on the first ferromagnetic layer 31. Subsequently, a $MgA_2O_4$ layer (having a thickness of 0.9 nm) for supplying a part of the elements of the main body region 34 was formed on the $In_2O_3$ layer. Subsequently, an $In_2O_3$ layer (having a thickness of 0.15 nm) for supplying a part of the elements of the second interface region 36 was formed on the $MgAl_2O_4$ layer.

Next, the second ferromagnetic layer 32 as the magnetization free layer was formed on the tunnel barrier layer 33p by a sputtering method. The second ferromagnetic layer 32 was a two-layer stacked body consisting of a CoFe layer (having a thickness of 1 nm) and a CoFeB layer (having a thickness of 5 nm). The spin valve layer 30p was produced by forming the second ferromagnetic layer 32.

After the spin valve layer 30p was produced, the cap layer 40 was formed on the spin valve layer 30p. Specifically, the cap layer 40 was formed on the second ferromagnetic layer 32 of the spin valve layer 30p by a sputtering method. The cap layer 40 was a stacked body consisting of a Ta layer (having a thickness of 5 nm) and a Ru layer (having a thickness of 20 nm).

After the cap layer 40 was formed, a heat treatment in a magnetic field was performed, and unidirectional magnetic anisotropy was imparted to the CoFe layer as the third ferromagnetic layer and the two-layered stacked body as the first ferromagnetic layer 31 consisting of the CoFeB layer and the CoFe layer. A heat treatment temperature in the heat treatment in the magnetic field was set to 300° C., and an intensity of the applied magnetic field was set to 10 kOe (798 kA/m). The formation of the magnetoresistive effect element 1p according to Example 1 was completed by the heat treatment in the magnetic field.

In Example 1, due to the heat treatment in the magnetic field, atomic diffusion between layers and crystallization to a spinel structure were accelerated in the tunnel barrier layer 33p (the $In_2O_3$ layer, the $MgAl_2O_4$ layer and the $In_2O_3$ layer), and an $Mg(Al_{\alpha 1}In_{1-\alpha 1})_2O_4$ layer as the first interface region 35, a $Mg(Al_{\alpha 2}In_{1-\alpha 2})_2O_4$ layer as the main body region 34, and a $Mg(Al_{\alpha 3}In_{1-\alpha 3})_2O_4$ layer as the second interface region 36 were formed. In these layers, magnitudes of $\alpha 1$ and $\alpha 3$ were smaller than a magnitude of $\alpha 2$. The magnitude relationship between $\alpha 1$, $\alpha 2$ and $\alpha 3$ means that a content of the element X (In in Example 1) in the first interface region 35 and the second interface region 36 is larger than a content of the element X in the main body region 34.

(Evaluation of MR ratio)

Figure 3:
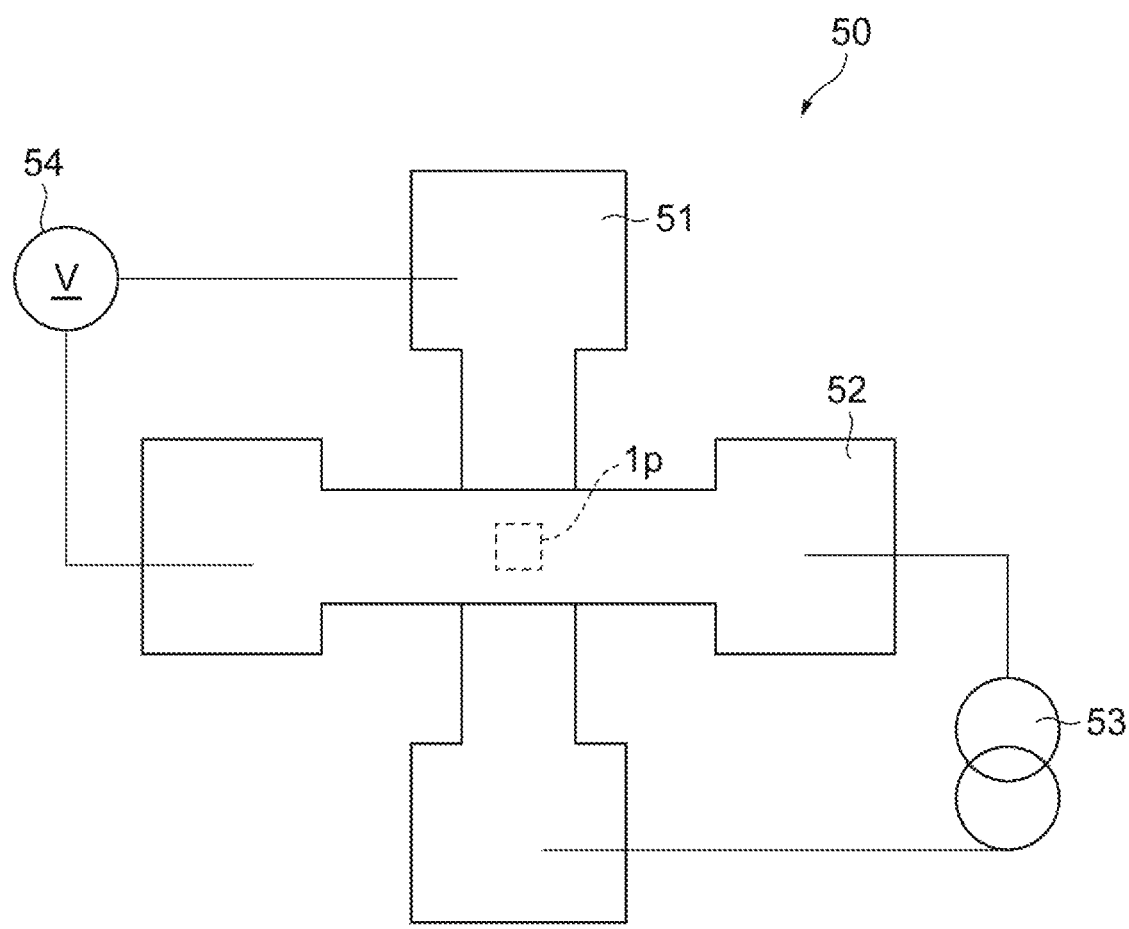
FIG. 3 is a diagram showing a magnetoresistive device capable of evaluating an MR ratio of the magnetoresistive effect element according to Example 1.

FIG. 3 is a diagram showing a magnetoresistive device capable of evaluating the MR ratio of the magnetoresistive effect element according to Example 1. A magnetoresistive device 50 is a device capable of evaluating the MR ratio by a four-terminal method and includes a first electrode layer 51 and a second electrode layer 52 sandwiching the magnetoresistive effect element 1p together with the first electrode layer 51. The magnetoresistive effect element 1p was microfabricated into a shape suitable for measurement of the magnetoresistive characteristics. The first electrode layer 51 was connected to the base layer 20 on the substrate 10 of the magnetoresistive effect element 1p, and the second electrode layer 52 was connected to the cap layer 40 of the magnetoresistive effect element 1p. The magnetoresistive device 50 further included a power source 53 and a voltmeter 54, and both the power source 53 and the voltmeter 54 were connected to the first electrode layer 51 and the second electrode layer 52. A current was applied to the magnetoresistive effect element 1p in the stacking direction using the power supply 53, and a voltage applied to the magnetoresistive effect element 1p at this time could be monitored by the voltmeter 54. In the embodiment, in a state in which a constant current was applied to the magnetoresistive effect element 1p in the stacking direction, change in resistance of the magnetoresistive effect element 1p was measured by monitoring the voltage applied to the magnetoresistive effect element 1p with the voltmeter 54 while sweeping the magnetic field from the outside to the magnetoresistive effect element 1p.

In the embodiment, the MR ratio of the magnetoresistive effect element 1p was evaluated by the four-terminal method, but the evaluation method of the MR ratio is not limited to the four-terminal method. For example, the MR ratio of the magnetoresistive effect element 1p may also be evaluated by a current-in-plane-tunneling (CIPT) method.

In the embodiment, the MR ratio of the magnetoresistive effect element 1p was calculated from a measurement result of the resistance change.

The MR ratio is expressed in percentage and can be calculated by the following Equation (1).

$$\text{MR ratio}(\%)=((R_{AP}-R_P)/R_P)\times 100(\%) \tag{1}$$

In Equation (1), $R_{AP}$ is a value of the resistance of the magnetoresistive effect element 1p when a magnetization direction of the first ferromagnetic layer 31 and a magnetization direction of the second ferromagnetic layer 32 are antiparallel. Further, $R_P$ is a value of the resistance of the magnetoresistive effect element 1p when the magnetization direction of the first ferromagnetic layer 31 and the magnetization direction of the second ferromagnetic layer 32 are parallel.

(Evaluation of Area Resistance)

In Example 1, the resistance change of the magnetoresistive effect element 1p was measured using the magnetoresistive device 50, and area resistance of the magnetoresistive effect element 1p was evaluated from the measurement result. In the embodiment, when an area of the magnetoresistive effect element 1p in a plan view shape is A, $R_PA$ obtained by multiplying $R_P$ in the formula (1) and A is defined as RA (the area resistance). RA is a numerical value obtained by the resistance value obtained by dividing an applied bias voltage by a current flowing in the stacking direction of the magnetoresistive effect element 1p being divided by a reciprocal number of an area of a surface, to which each layer is bonded, and then normalized to a resistance value in unit area (Energy Dispersive X-Ray Spectrometry)

In the embodiment, an energy dispersive X-ray spectrometry (EDS) was performed on the magnetoresistive effect element 1p, and a composition of the magnetoresistive effect element 1p was analyzed. First, the magnetoresistive effect element 1p was cut along a plane in the stacking direction using a focused ion beam, and a thin piece sample of the tunnel barrier layer 33p was produced. Next, the energy dispersive X-ray spectrometry (EDS) was performed on this thin piece sample using a transmission electron microscope (TEM). An analysis result by the EDS using the TEM (TEM-EDS) is an evaluation result obtained by removing background signals of measurement elements such as Mg, Al, and oxygen (O).

In the embodiment, the method of analyzing the composition of the magnetoresistive effect element 1p was performed by the energy dispersive X-ray spectrometry (EDS), but the method of analyzing the composition of the magnetoresistive effect element 1p is not limited to EDS. For example, the composition of the magnetoresistive effect element 1p may also be analyzed by secondary ion mass spectrometry (SIMS), an atom probe method, or electron energy loss spectroscopy (EELS).

Example 2

As Example 2, for each layer except the tunnel barrier layer 33, a magnetoresistive effect element was produced in the same configuration and the same manner as in Example 1.

In the formation of a tunnel barrier layer 33p of Example 2, first, a $Ga_2O_3$ layer (having a thickness of 0.15 nm) for supplying a part of the elements of the first interface region 35 was formed on the first ferromagnetic layer 31. After the $Ga_2O_3$ layer was formed, an annealing treatment (at a temperature of 300° C.) was performed for 15 minutes. Subsequently, a $MgAl_2O_4$ layer (having a thickness of 0.9 nm) for supplying a part of the elements of the main body region 34 was formed on the $Ga_2O_3$ layer. After the $MgA_2O_4$ layer was formed, the annealing treatment (at a temperature of 300° C.) was performed for 15 minutes. Subsequently, a $Ga_2O_3$ layer (having a thickness of 0.15 nm) for supplying a part of the elements of the second interface region 36 was formed on the $MgAl_2O_4$ layer. After the $Ga_2O_3$ layer was formed, the annealing treatment (at a temperature of 300° C.) was performed for 15 minutes.

In Example 2, due to the annealing treatment after the formation of the $Ga_2O_3$ layer, the $MgAl_2O_4$ layer and the $Ga_2O_3$ layer, atomic diffusion between layers and crystallization to a spinel structure were accelerated in these layers, and an $Mg(Al_{\alpha 1}Ga_{1-\alpha 1})_2O_4$ layer as the first interface region 35, a $Mg(Al_{\alpha 2}Ga_{1-\alpha 2})_2O_4$ layer as the main body region 34, and a $Mg(Al_{\alpha 3}Ga_{1-\alpha 3})_2O_4$ layer as the second interface region 36 were formed. In these layers, magnitudes of $\alpha 1$ and $\alpha 3$ are smaller than a magnitude of $\alpha 2$. The magnitude relation of $\alpha 1$, $\alpha 2$ and $\alpha 3$ means that a content of the element X (Ga in Example 2) in the first interface region 35 and the second interface region 36 is larger than a content of the element X in the main body region 34.

In Example 2, like Example 1, after the cap layer 40 was formed, the heat treatment in the magnetic field was performed, and thus the unidirectional magnetic anisotropy was imparted to the CoFe layer as the third ferromagnetic layer and the two-layered stacked body consisting of the CoFeB layer and the CoFe layer as the first ferromagnetic layer 31. Further, in Example 2, like Example 1, the evaluation of the MR ratio, the evaluation of the area resistance, and the energy dispersive X-ray spectrometry were performed on the magnetoresistive effect element.

Example 3

As Example 3, for each layer except the tunnel barrier layer 33, a magnetoresistive effect element was produced in the same configuration and the same manner as in Example 1.

In the formation of a tunnel barrier layer 33p of Example 3, first, an MgO layer (having a thickness of 0.15 nm) for supplying a part of the elements of the first interface region 35 was formed on the first ferromagnetic layer 31. After the formation of the MgO layer, an annealing treatment (at a temperature of 300° C.) was performed for 15 minutes. Subsequently, a $MgAl_2O_4$ layer (having a thickness of 0.9 nm) for supplying a part of the elements of the main body region 34 was formed on the MgO layer. After the MgAl$_2$O$_4$ layer was formed, the annealing treatment (at a temperature of 300° C.) was performed for 15 minutes. Subsequently, an MgO layer (having a thickness of 0.15 nm) for supplying a part of the elements of the second interface region 36 was formed on the MgAl$_2$O$_4$ layer. After the MgO layer was formed, the annealing treatment (at a temperature of 300° C.) was performed for 15 minutes.

In Example 3, due to the annealing treatment after the MgO layer, the MgA$_2$O$_4$ layer and the MgO layer were formed, atomic diffusion between layers and crystallization to a spinel structure were accelerated in these layers, and an Mg(Al$_{\alpha1}$Mg$_{1-\alpha1}$)$_2$O$_4$ layer as the first interface region 35, a Mg(Al$_{\alpha2}$Mg$_{1-\alpha2}$)$_2$O$_4$ layer as the main body region 34, and a Mg(Al$_{\alpha3}$Mg$_{1-\alpha3}$)$_2$O$_4$ layer as the second interface region 36 were formed. In these layers, magnitudes of α1 and α3 are smaller than a magnitude of α2. The magnitude relation of α1, α2, and α3 means that a content of the element X (Mg in Example 3) in the first interface region 35 and the second interface region 36 is larger than a content of the element X in the main body region 34.

In Example 3, like Example 1, after the cap layer 40 was formed, the heat treatment in the magnetic field was performed, and the unidirectional magnetic anisotropy was imparted to the CoFe layer as the third ferromagnetic layer and the two-layered stacked body consisting of the CoFeB layer and the CoFe layer as the first ferromagnetic layer 31. Further, in Example 3, like Example 1, the evaluation of the MR ratio, the evaluation of the area resistance, and the energy dispersive X-ray spectrometry were performed on the magnetoresistive effect element.

Example 4

As Example 4, a magnetoresistive effect element having the same configuration as that of the magnetoresistive effect element 1p of the above-described modified example (the modified example in which the first ferromagnetic layer 31 serves as the magnetization free layer and the second ferromagnetic layer 32 serves as the magnetization fixed layer) of the second embodiment shown in FIG. 2 was produced. In Example 4, MgO was used as the substrate 10. This MgO substrate was annealed (at a temperature of 800° C.) for 60 minutes. A buffer layer as the base layer 20 was formed on a (001) surface of MgO as the substrate 10 by a sputtering method. The buffer layer has a Cr layer (having a thickness of 40 nm). After the buffer layer was formed, an annealing treatment (at a temperature of 800° C.) was performed for 60 minutes.

Subsequently, a spin valve layer 30p was formed by a sputtering method. In the formation of the spin valve layer 30p, first, the first ferromagnetic layer 31 as the magnetization free layer was formed. The first ferromagnetic layer 31 was a Fe layer (having a thickness of 50 nm). After the first ferromagnetic layer 31 was formed, an annealing treatment (at a temperature of 300° C.) was performed for 60 minutes.

Subsequently, a tunnel barrier layer 33p was formed on the first ferromagnetic layer 31. In the process of forming the tunnel barrier layer 33p, first, an In$_2$O$_3$ layer (having a thickness of 0.15 nm) for supplying a part of the elements of the first interface region 35 was formed on the first ferromagnetic layer 31. After the In$_2$O$_3$ layer was formed, an annealing treatment (at a temperature of 450° C.) was performed for 15 minutes. Subsequently, a MgAl$_2$O$_4$ layer (having a thickness of 0.9 nm) for supplying a part of the elements of the main body region 34 was formed on the In$_2$O$_3$ layer. After the MgAl$_2$O$_4$ layer was formed, an annealing treatment (at a temperature of 450° C.) was performed for 15 minutes. Subsequently, an In$_2$O$_3$ layer (having a thickness of 0.15 nm) for supplying a part of the elements of the second interface region 36 was formed on the MgA$_2$O$_4$ layer. After the In$_2$O$_3$ layer was formed, an annealing treatment (at a temperature of 450° C.) was performed for 15 minutes.

In Example 4, due to the annealing treatment after the In$_2$O$_3$ layer, the MgAl$_2$O$_4$ layer and the In$_2$O$_3$ layer were formed, atomic diffusion between layers and crystallization to a spinel structure were accelerated in these layers, and an Mg(Al$_{\alpha1}$In$_{1-\alpha1}$)$_2$O$_4$ layer as the first interface region 35, a Mg(Al$_{\alpha2}$In$_{1-\alpha2}$)$_2$O$_4$ layer as the main body region 34, and a Mg(Al$_{\alpha3}$In$_{1-\alpha3}$)$_2$O$_4$ layer as the second interface region 36 were formed. In these layers, magnitudes of α1 and α3 are smaller than a magnitude of α2. The magnitude relation of α1, α2 and α3 means that a content of the element X (In in Example 4) in the first interface region 35 and the second interface region 36 is larger than a content of the element X in the main body region 34.

Next, the magnetization fixed layer was formed on the tunnel barrier layer 33p by a sputtering method. The magnetization fixed layer was a stacked body consisting of a Fe layer (having a thickness of 60 nm) as the second ferromagnetic layer 32 and a IrMn layer (having a thickness of 10 nm) as the antiferromagnetic layer. After the Fe layer was formed, an annealing treatment (at a temperature of 300° C.) was performed for 15 minutes. A spin valve layer 30p was produced by forming the magnetization fixed layer.

Next, the cap layer 40 was formed on the spin valve layer 30p. The cap layer 40 was a Ru layer (having a thickness of 20 nm).

After the cap layer 40 was formed, a heat treatment in a magnetic field was performed, and thus unidirectional magnetic anisotropy was imparted to the Fe layer as the second ferromagnetic layer 32. A heat treatment temperature in the heat treatment in the magnetic field was 200° C., and an intensity of the applied magnetic field was 10 kOe (798 kA/m). The formation of the magnetoresistive effect element 1p according to Example 4 was completed by the heat treatment in the magnetic field.

In Example 4, as in Example 1, the evaluation of the MR ratio, the evaluation of the area resistance, and the energy dispersive X-ray spectrometry were performed on the magnetoresistive effect element.

Example 5

As Example 5, a magnetoresistive effect element having the same configuration as the magnetoresistive effect element 1 of the first embodiment shown in FIG. 1 was produced. In Example 5, the tunnel barrier layer 33 does not have the second interface region, unlike the Example 1 to Example 4. In the description relating to Example 5, the reference numerals used for the explanation of the magnetoresistive effect element 1 are cited.

In Example 5, MgO was used as the substrate 10. This MgO substrate was annealed (at a temperature of 800° C.) for 60 minutes. A buffer layer as the base layer 20 was formed on a (001) surface of MgO as the substrate 10 by a sputtering method. The buffer layer has a Cr layer (having a thickness of 40 nm). After the buffer layer was formed, an annealing treatment (at a temperature of 800° C.) was performed for 60 minutes.

Subsequently, the spin valve layer 30 was formed by a sputtering method. The spin valve layer 30 according to Example 5 has a first ferromagnetic layer 31 as a magnetization free layer, a tunnel barrier layer 33, and a magnetization fixed layer in this order. First, the first ferromagnetic layer 31 was formed. The first ferromagnetic layer 31 was a Fe layer (having a thickness of 50 nm). After the first ferromagnetic layer 31 was formed, an annealing treatment (at a temperature of 300° C.) was performed for 60 minutes.

Subsequently, the tunnel barrier layer 33 was formed on the first ferromagnetic layer 31 by a sputtering method. In the process of forming the tunnel barrier layer 33, first, an $In_2O_3$ layer (having a thickness of 0.15 nm) for supplying a part of the elements of the first interface region 35 was formed on the first ferromagnetic layer 31. After the $In_2O_3$ layer was formed, an annealing treatment (at a temperature of 450° C.) was performed for 15 minutes. Subsequently, a $MgAl_2O_4$ layer (having a thickness of 0.9 nm) for supplying a part of the elements of the main body region 34 was formed on the $In_2O_3$ layer. After the $MgAl_2O_4$ layer was formed, an annealing treatment (at a temperature of 450° C.) was performed for 15 minutes.

In Example 5, due to the annealing treatment after the $In_2O_3$ layer and the $MgAl_2O_4$ layer were formed, atomic diffusion between layers and crystallization to a spinel structure were accelerated in these layers, and an $Mg(Al_{\alpha 4}In_{1-\alpha 4})_2O_4$ layer as the first interface region 35 and a $Mg(Al_{\alpha 5}In_{1-\alpha 5})_2O_4$ layer as the main body region 34 were formed. In these layers, a magnitude of α4 is smaller than a magnitude of α5. The magnitude relation of α4 and α5 means that a content of the element X (In in Example 5) in the first interface region 35 is larger than a content of the element X in the main body region 34.

Next, as in Example 4, the magnetization fixed layer was formed on the tunnel barrier layer 33, and the cap layer 40 was formed on the spin valve layer 30. After the formation of the cap layer 40, as in Example 4, the heat treatment in the magnetic field was performed, and unidirectional magnetic anisotropy was imparted to the Fe layer as the second ferromagnetic layer 32.

In Example 5, as in Example 1, the evaluation of the MR ratio, the evaluation of the area resistance, and the energy dispersive X-ray spectrometry were performed on the magnetoresistive effect element.

Comparative Example 1

FIG. 4A is a diagram showing a cross section of a magnetoresistive effect element according to Comparative example 1. Comparative example 1 includes the same substrate 10 as that of the magnetoresistive effect element according to Example 1. Further, the magnetoresistive effect element 1a according to Comparative example 1 includes the base layer 20 and the cap layer 40 which were formed in the same configuration and in the same manner as in Example 1. A tunnel barrier layer 33a of Comparative example 1 has the main body region but does not have the first interface region and the second interface region.

In Comparative example 1, a spin valve layer 30a was formed on the base layer 20 by a sputtering method. In the process of forming the spin valve layer 30a, first, a magnetization fixed layer 31a was formed. The magnetization fixed layer 31a of Comparative example 1 was formed in the same manner as that of the magnetization fixed layer of the SAF structure of Example 1 and has the same configuration.

Next, the tunnel barrier layer 33a was formed on the magnetization fixed layer 31a by a sputtering method. In the formation of the tunnel barrier layer 33a, a $MgA_2O_4$ layer (having a thickness of 1.2 nm) as the main body region was formed on the magnetization fixed layer.

Next, the second ferromagnetic layer 32 as the magnetization free layer was formed on the tunnel barrier layer 33a by a sputtering method. The second ferromagnetic layer 32 of Comparative example 1 was formed in the same manner as that of the second ferromagnetic layer 32 of Example 1 and has the same configuration.

In Comparative example 1, as in Example 1, after the formation of the cap layer 40, the heat treatment in the magnetic field was performed, and unidirectional magnetic anisotropy was imparted to the CoFe layer as the third ferromagnetic layer and the two-layered stacked body consisting of the CoFeB layer and the CoFe layer as the first ferromagnetic layer 31.

In Comparative example 1, as in Example 1, the evaluation of the MR ratio, the evaluation of the area resistance, and the energy dispersive X-ray spectrometry were performed on the magnetoresistive effect element 1a.

Comparative Example 2

FIG. 4B is a diagram showing a cross section of a magnetoresistive effect element according to Comparative example 2. Comparative example 2 includes the same substrate 10 as that of the magnetoresistive effect element according to Example 1. Further, a magnetoresistive effect element 1b according to Comparative example 2 includes the base layer 20 and the cap layer 40 which were formed in the same manner as in Example 1 and have the same configuration.

In Comparative example 2, a spin valve layer 30b was formed on the base layer 20 by a sputtering method. In the process of forming the spin valve layer 30b, first, a magnetization fixed layer 31b was formed, like the magnetization fixed layer 31a of Comparative example 1.

Next, a tunnel barrier layer 33b was formed on the magnetization fixed layer 31b by a sputtering method. In the process of forming the tunnel barrier layer 33b, first, a $MgA_2O_4$ layer (having a thickness of 0.50 nm) for supplying a part of elements of a first interface region 35b was formed on the magnetization fixed layer 31b. After the formation of the first interface region 35b, an annealing treatment (at a temperature of 300° C.) was performed for 15 minutes. Subsequently, an $In_2O_3$ layer (having a thickness of 0.15 nm) for supplying a part of elements of a main body region 34b was formed on the first interface region 35b. After the formation of the main body region 34b, an annealing treatment (at a temperature of 300° C.) was performed for 15 minutes. Subsequently, an $MgAl_2O_4$ layer (having a thickness of 0.50 nm) as a second interface region 36b was formed on the main body region 34b. After the formation of the second interface region 36b, an annealing treatment (at a temperature of 300° C.) was performed for 15 minutes.

In Comparative example 2, due to the annealing treatment after the $MgAl_2O_4$ layer, the $In_2O_3$ layer and the $MgAl_2O_4$ layer were formed, atomic diffusion between layers and crystallization to a spinel structure were accelerated in these layers, and an $Mg(Al_{\alpha 6}Mg_{1-\alpha 6})_2O_4$ layer as the first interface region 35b, a $Mg(Al_{\alpha 7}Mg_{1-\alpha 7})_2O_4$ layer as the main body region 34b, and a $Mg(Al_{\alpha 8}Mg_{1-\alpha 8})_2O_4$ layer as the second interface region 36b were formed. In these layers, magnitudes of α6 and α8 are larger than a magnitude of α7. The magnitude relation of α6, α7 and α8 means that a content of the element X (In in Comparative example 2) in the first interface region 35b and the second interface region 36b is smaller than a content of the element X in the main body region 34b.

The second ferromagnetic layer 32 as the magnetization free layer was formed on the tunnel barrier layer 33b by a sputtering method. The second ferromagnetic layer 32 of Comparative example 2 was formed in the same manner as that of the second ferromagnetic layer 32 of Example 1 and has the same configuration.

In Comparative example 2, as in Example 1, after the formation of the cap layer 40, the heat treatment in the magnetic field was performed, and unidirectional magnetic anisotropy was imparted to the CoFe layer as the third ferromagnetic layer and the two-layered stacked body consisting of the CoFeB layer and the CoFe layer as the first ferromagnetic layer 31.

In Comparative example 2, the evaluation of the MR ratio, the evaluation of the area resistance, and the energy dispersive X-ray spectrometry were performed on the magnetoresistive effect element 1b in the same manner as in Example 1.

Table 1 is a table showing the material of each layer included in the magnetoresistive effect elements, the evaluation results of the MR ratios, and the evaluation results of the area resistances according to Examples 1 to 3. Table 2 is a table showing the material of each layer included in the magnetoresistive effect elements, the evaluation results of the MR ratios, and the evaluation results of the area resistances according to Example 4 and Example 5. Table 3 is a table showing the material of each layer included in the magnetoresistive effect elements, the evaluation results of the MR ratios, and the evaluation results of the area resistances according to Comparative example 1 and Comparative example 2.

In Tables 1 to 3, the evaluation results of the MR ratios are indicated by a relative value when the magnitude of the MR ratio according to Comparative Example 1 is set to "1." Similarly, the evaluation results of the area resistances are indicated by a relative value when the magnitude of RA according to Comparative Example 1 is set to "1."

TABLE 1

|  |  | Example 1 | Example 2 | Example 3 |
|---|---|---|---|---|
| Substrate |  | Si | Si | Si |
| Buffer layer |  | Ta/Ru | Ta/Ru | Ta/Ru |
| Magnetization fixed layer |  | IrMn/CoFe/Ru/CoFeB/CoFe | IrMn/CoFe/Ru/CoFeB/CoFe | IrMn/CoFe/Ru/CoFeB/CoFe |
| Tunnel barrier layer | First interface region | $Mg(Al_{\alpha 1}In_{1-\alpha 1})_2O_4$ | $Mg(Al_{\alpha 1}Ga_{1-\alpha 1})_2O_4$ | $Mg(Al_{\alpha 1}Mg_{1-\alpha 1})_2O_4$ |
|  | Main body region | $Mg(Al_{\alpha 2}In_{1-\alpha 2})_2O_4$ | $Mg(Al_{\alpha 2}Ga_{1-\alpha 2})_2O_4$ | $Mg(Al_{\alpha 2}Mg_{1-\alpha 2})_2O_4$ |
|  | Second interface region | $Mg(Al_{\alpha 3}In_{1-\alpha 3})_2O_4$ | $Mg(Al_{\alpha 3}Ga_{1-\alpha 3})_2O_4$ | $Mg(Al_{\alpha 3}Mg_{1-\alpha 3})_2O_4$ |
| Magnetization free layer |  | CoFe/CoFeB | CoFe/CoFeB | CoFe/CoFeB |
| Cap layer |  | Ta/Ru | Ta/Ru | Ta/Ru |
| MR ratio(relative value) |  | 4.01 | 2.53 | 1.38 |
| RA(relative value) |  | 0.53 | 0.27 | 10.83 |

TABLE 2

|  |  | Example 4 | Example 5 |
|---|---|---|---|
| Substrate |  | MgO | MgO |
| Buffer layer |  | Cr | Cr |
| Magnetization free layer |  | Fe | Fe |
| Tunnel barrier layer | First interface region | $Mg(Al_{\alpha 1}In_{1-\alpha 1})_2O_4$ | $Mg(Al_{\alpha 4}In_{1-\alpha 4})_2O_4$ |
|  | Main body region | $Mg(Al_{\alpha 2}In_{1-\alpha 2})_2O_4$ | $Mg(Al_{\alpha 5}In_{1-\alpha 5})_2O_4$ |
|  | Second interface region | $Mg(Al_{\alpha 3}In_{1-\alpha 3})_2O_4$ | — |
| Magnetization fixed layer |  | Fe/IrMn | Fe/IrMn |
| Cap layer |  | Ru | Ru |
| MR ratio(relative value) |  | 4.81 | 1.09 |
| RA(relative value) |  | 0.58 | 0.70 |

TABLE 3

|  |  | Comparative example 1 | Comparative example 2 |
|---|---|---|---|
| Substrate |  | Si | Si |
| Buffer layer |  | Ta/Ru | Ta/Ru |
| Magnetization fixed layer |  | IrMn/CoFe/Ru/CoFeB/CoFe | IrMn/CoFe/Ru/CoFeB/CoFe |
| Tunnel barrier layer | First interface region | — | $Mg(Al_{\alpha 6}In_{1-\alpha 6})_2O_4$ |
|  | Main body region | $MgAl_2O_4$ | $Mg(Al_{\alpha 7}In_{1-\alpha 7})_2O_4$ |
|  | Second interface region | — | $Mg(Al_{\alpha 8}In_{1-\alpha 8})_2O_4$ |
| Magnetization free layer |  | CoFe/CoFeB | CoFe/CoFeB |
| Cap layer |  | Ta/Ru | Ta/Ru |
| MR ratio(relative value) |  | 1 | 0.69 |
| RA(relative value) |  | 1 | 0.05 |

As shown in Tables 1 to 3, the MR ratios of Example 1 to Example 5 are larger than those of Comparative Example 1 and Comparative Example 2. Also, the RAs of Example 1, Example 2, Example 4, and Example 5 are smaller than that of Comparative Example 1.

Figure 5A:
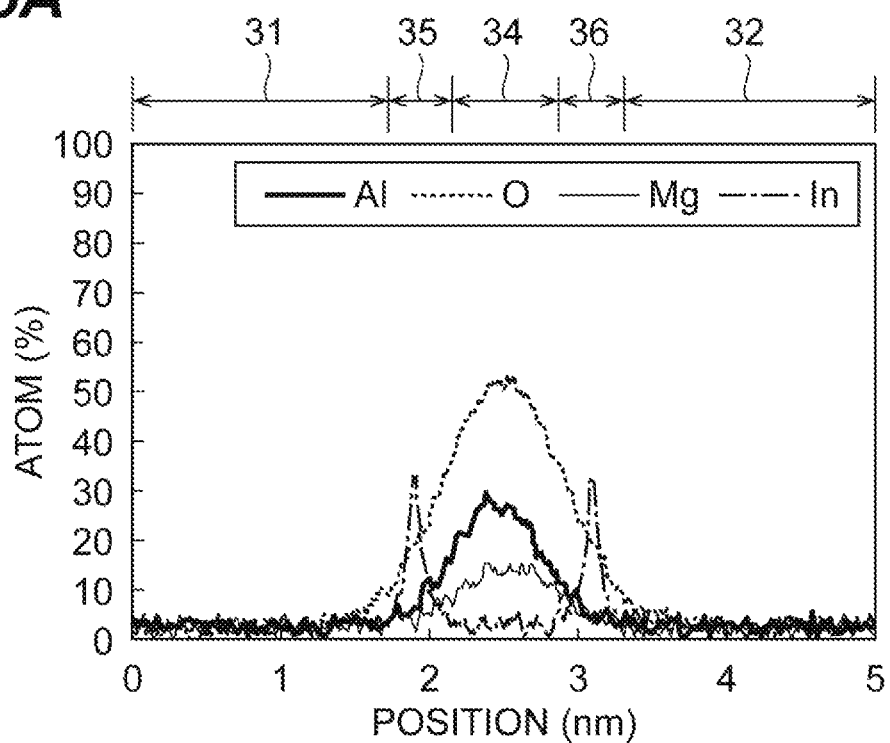
FIG. 5A is a diagram showing analysis results of an energy dispersive X-ray spectrometry according to Example 1.
Figure 5B:
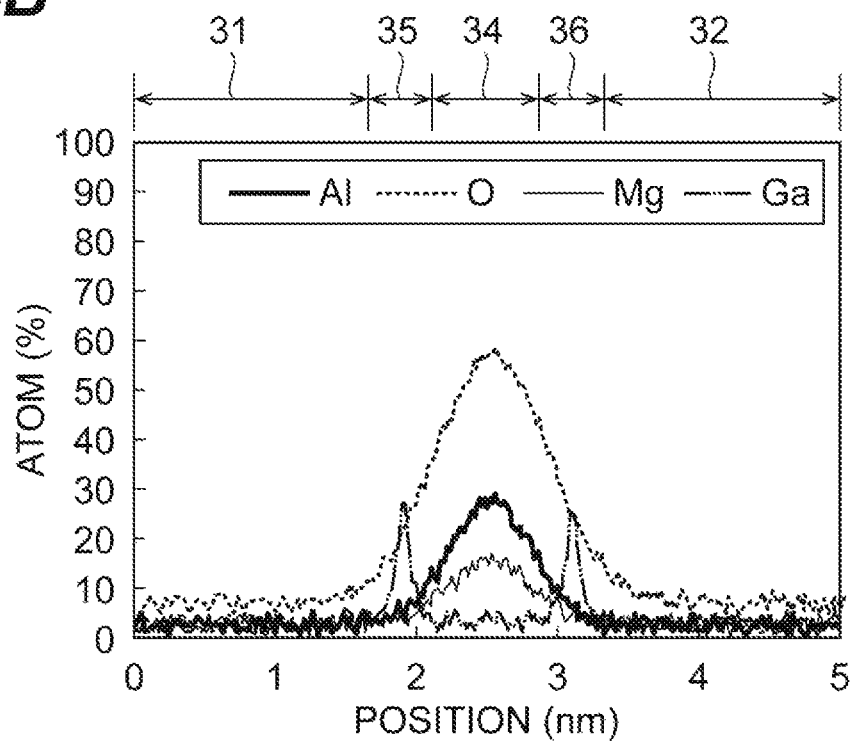
FIG. 5B is a diagram showing an analysis result of an energy dispersive X-ray spectrometry according to Example 2.

FIG. 5A is a diagram showing an analysis result of the energy dispersive X-ray spectrometry according to Example 1. FIG. 5B is a diagram showing an analysis result of the energy dispersive X-ray spectrometry according to Example 2.

Figure 6A:
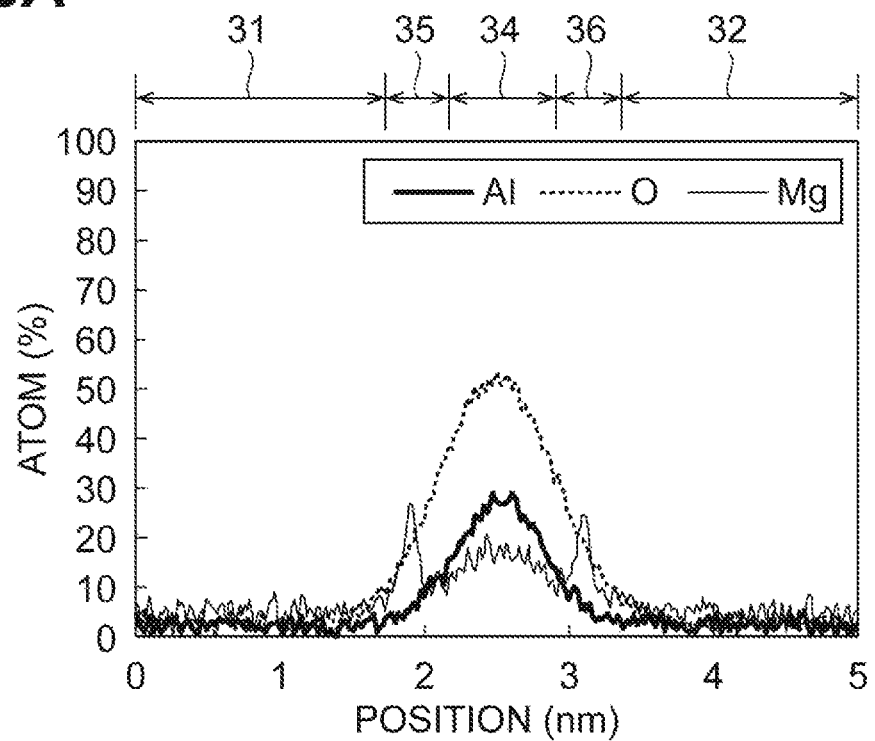
FIG. 6A is a diagram showing an analysis result of an energy dispersive X-ray spectrometry according to Example 3.
Figure 6B:
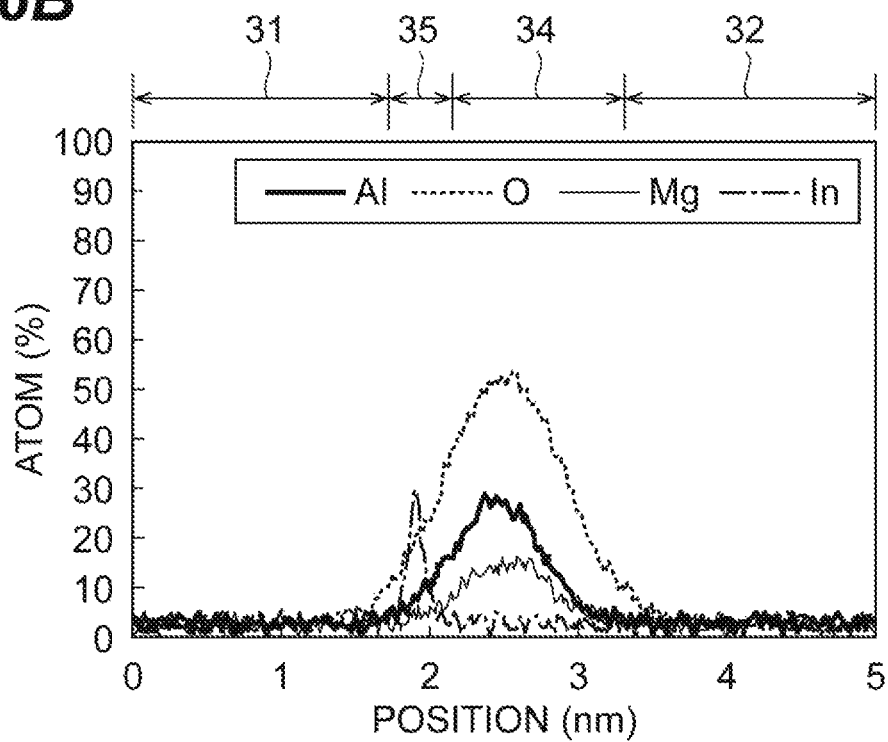
FIG. 6B is a diagram showing an analysis result of an energy dispersive X-ray spectrometry according to Example 5.

FIG. 6A is a diagram showing an analysis result of the energy dispersive X-ray spectrometry according to Example 3. FIG. 6B is a diagram showing an analysis result of the energy dispersive X-ray spectrometry according to Example 5. Since the energy dispersive X-ray spectrometry according to Example 4 has the analysis result similar to that of the energy dispersive X-ray spectrometry according to Example 1, the analysis result according to Example 4 is not shown.

Figure 7A:
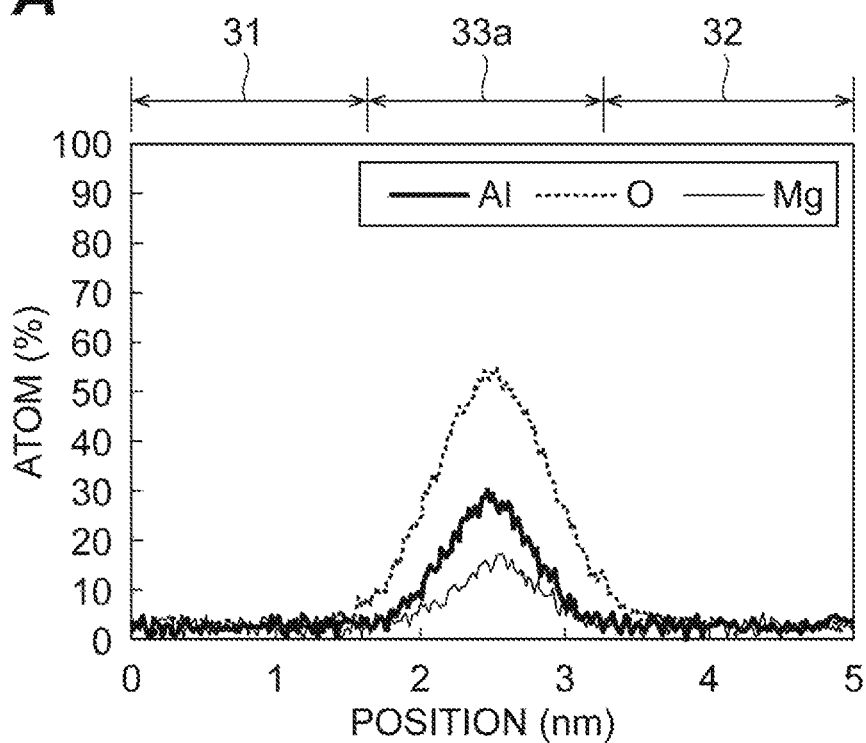
FIG. 7A is a diagram showing an analysis result of an energy dispersive X-ray spectrometry according to Comparative example 1.
Figure 7B:
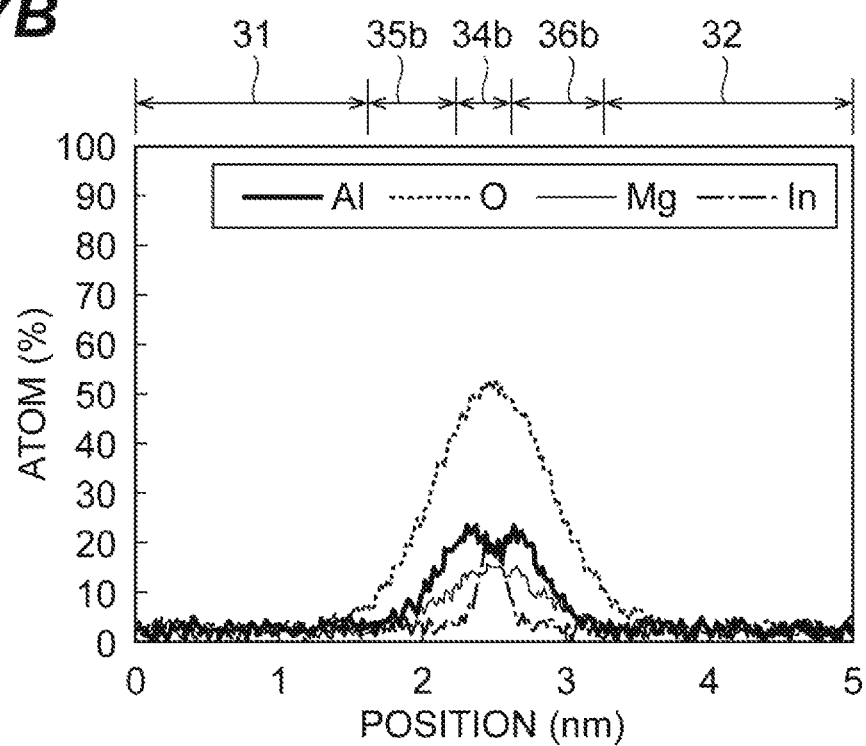
FIG. 7B is a diagram showing an analysis result of an energy dispersive X-ray spectrometry according to Comparative example 2.

FIG. 7A is a diagram showing an analysis result of the energy dispersive X-ray spectrometry according to Comparative example 1. FIG. 7B is a diagram showing an analysis result of the energy dispersive X-ray spectrometry according to Comparative example 2.

Each of the drawings from FIG. 5A to FIG. 7B shows the content of each element contained in each layer included in the spin valve layer 30p. In the drawing, a horizontal axis shows a distance from a predetermined origin in the spin valve layer 30p, and a unit thereof is nm. In addition, to indicate a range of each layer in the spin valve layer 30p, for example, a symbol "35" of the first interface region 35 is given to the horizontal axis. A vertical axis indicates the content of each element obtained from the analysis result of the energy dispersive X-ray spectrometry, and a unit thereof is %. In each of the drawings from FIG. 5A to FIG. 7B, only the elements mainly constituting the tunnel barrier layer 33p are shown, and the analysis results of the elements mainly contained in the first ferromagnetic layer 31 and the second ferromagnetic layer 32, specifically, the elements such as Fe, Co and B are not shown.

In the magnetoresistive effect elements according to Example $_1$ to Example 3, each of the tunnel barrier layers 33 has the first interface region 35, the main body region 34 and the second interface region 36.

As shown in FIG. 5A, in the magnetoresistive effect element according to Example 1, the atomic percentage (%) of Al had a peak in the main body region 34, while it decreased as approaching the first interface region 35 and the second interface region 36. In contrast, the atomic percentage (%) of In had peaks in the first interface region 35 and in the second interface region 36, while it decreased as approaching the main body region 34. In the magnetoresistive effect element according to Example 4, the results similar to those in FIG. 5A were obtained.

As shown in FIG. 5B and FIG. 6A, in the magnetoresistive effect elements according to Example 2 and Example 3, both atomic percentages (%) of Al had a peak in the main body region 34, while they decreased as approaching the first interface region 35 and the second interface region 36. In contrast, in Example 2, the atomic percentage (%) of Ga had peaks in the first interface region 35 and in the second interface region 36, while it decreased as approaching the main body region 34. In Example 3, the atomic percentage (%) of Mg had peaks in the first interface region 35 and in the second interface region 36, while it decreased as approaching the main body region 34.

In the magnetoresistive effect element according to Example 5, the tunnel barrier layer 33 has the first interface region 35 and the body region 34 but does not have the second interface region 36.

As shown in FIG. 6B, in the magnetoresistive effect element according to Example 5, the atomic percentage (%) of Al had a peak in the main body region 34, while it decreased as approaching the first interface region 35. The atomic percentage (%) of In had a peak only in the first interface region 35, and the peak decreased as approaching the main body region 34.

In the magnetoresistive effect element according to Comparative Example 1, the tunnel barrier layer 33a does not have regions corresponding to the first interface region and the second interface region. In the magnetoresistive effect element according to Comparative Example 2, the tunnel barrier layer 33b includes the MgAl$_2$O$_4$ layer in the first interface region 35b and the second interface region 36b and includes the In$_2$O$_3$ layer in the body region 34b.

As shown in FIG. 7A, in the magnetoresistive effect element 1a according to Comparative Example 1, the atomic percentage (%) of Al had a peak in the tunnel barrier layer 33a. A peak of the atomic percentage (%) based on atoms such as In was not observed.

As shown in FIG. 7B, in the magnetoresistive effect element 1b according to Comparative Example 2, the atomic percentage (%) of Al had a peak in the tunnel barrier layer 33a. Further, the peak of the atomic percentage (%) of Al indicates a depression in the main body region 34b. In the main body region 34b, a peak of the atomic percentage (%) of In was observed.

Although the present disclosure has been described with reference to the embodiments and examples, the present disclosure is not limited to these embodiments and examples, and various modifications are possible.

According to the embodiment, a magnetoresistive effect element including a tunnel barrier layer having a spinel structure and having a large magnetoresistive effect is provided.

What is claimed is:

1. A magnetoresistive effect element comprising:
    a first ferromagnetic layer;
    a second ferromagnetic layer; and
    a tunnel barrier layer provided between the first ferromagnetic layer and the second ferromagnetic layer,
    wherein the tunnel barrier layer has a main body region and a first interface region,
    the main body region has an oxide material of a first spinel structure represented by a general formula LM$_2$O$_4$ (wherein L represents one or more kinds of elements including Mg, and M represents one or more kinds of elements including Al),
    the first interface region is provided between the main body region and the first ferromagnetic layer,
    the first interface region contains at least one kind of element X selected from a group consisting of elements having a valence of 2 and elements having a valence of 3 excluding Al and has an oxide material of a second spinel structure represented by a general formula DG$_2$O$_4$ (wherein D represents one or more kinds of elements including Mg or the element X, and G represents one or more kinds of elements including Al or the element X), and
    a content of the element X contained in the first interface region is larger than a content of the element X contained in the main body region.

2. The magnetoresistive effect element according to claim 1,
    wherein the tunnel barrier layer further has a second interface region,
    the second interface region is provided between the main body region and the second ferromagnetic layer,
    the second interface region contains the element X and has an oxide material of a third spinel structure represented by the general formula DG$_2$O$_4$, and
    a content of the element X contained in the second interface region is larger than the content of the element X contained in the main body region.

3. The magnetoresistive effect element according to claim 1,
    wherein the element X is an element belonging to the group 2 or 13 in the periodic table.

4. The magnetoresistive effect element according to claim 3,
    wherein the element X includes at least one of Mg, Ga and In.

5. The magnetoresistive effect element according to claim 3,
    wherein the element X includes Ga or In.

6. The magnetoresistive effect element according to claim 1,
    wherein at least one of the first ferromagnetic layer and the second ferromagnetic layer contains at least one of Co and Fe.

7. The magnetoresistive effect element according to claim 1,
wherein at least a part of the oxide material of the second spinel structure of the first interface region has a disordered spinel structure.

8. The magnetoresistive effect element according to claim 1,
wherein at least a part of the oxide material of the second spinel structure of the first interface region has an ordered spinel structure, and at least a part of the element X is arranged at a G site in the oxide material of the second spinel structure.

9. The magnetoresistive effect element according to claim 2,
wherein at least a part of the oxide material of the third spinel structure of the second interface region has a disordered spinel structure.

10. The magnetoresistive effect element according to claim 2,
wherein at least a part of the oxide material of the third spinel structure of the second interface region has an ordered spinel structure, and at least a part of the element X is arranged at a G site in the oxide material of the third spinel structure.

11. The magnetoresistive effect element according to claim 1,
wherein the tunnel barrier layer further has a second interface region,
the second interface region is provided between the main body region and the second ferromagnetic layer,
the second interface region contains the element X and has an oxide material of a third spinel structure represented by the general formula $DG_2O_4$,
a content of the element X contained in the second interface region is larger than the content of the element X contained in the main body region, and
the element X is an element belonging to the group 2 or 13 in the periodic table.

12. The magnetoresistive effect element according to claim 11,
wherein the element X includes at least one of Mg, Ga and In.

13. The magnetoresistive effect element according to claim 11,
wherein the element X includes Ga or In.

14. The magnetoresistive effect element according to claim 1,
wherein the tunnel barrier layer further has a second interface region,
the second interface region is provided between the main body region and the second ferromagnetic layer,
the second interface region contains the element X and has an oxide material of a third spinel structure represented by the general formula $DG_2O_4$,
a content of the element X contained in the second interface region is larger than the content of the element X contained in the main body region, and
at least one of the first ferromagnetic layer and the second ferromagnetic layer contains at least one of Co and Fe.

15. The magnetoresistive effect element according to claim 1,
wherein the tunnel barrier layer further has a second interface region,
the second interface region is provided between the main body region and the second ferromagnetic layer,
the second interface region contains the element X and has an oxide material of a third spinel structure represented by the general formula $DG_2O_4$,
a content of the element X contained in the second interface region is larger than the content of the element X contained in the main body region, and
at least a part of the oxide material of the second spinel structure of the first interface region has a disordered spinel structure.

16. The magnetoresistive effect element according to claim 1,
wherein the tunnel barrier layer further has a second interface region,
the second interface region is provided between the main body region and the second ferromagnetic layer,
the second interface region contains the element X and has an oxide material of a third spinel structure represented by the general formula $DG_2O_4$,
a content of the element X contained in the second interface region is larger than the content of the element X contained in the main body region, and
at least a part of the oxide material of the second spinel structure of the first interface region has an ordered spinel structure, and at least a part of the element X is arranged at a G site in the oxide material of the second spinel structure.

17. The magnetoresistive effect element according to claim 4,
wherein at least a part of the oxide material of the second spinel structure of the first interface region has a disordered spinel structure.

18. The magnetoresistive effect element according to claim 4,
wherein at least a part of the oxide material of the second spinel structure of the first interface region has an ordered spinel structure, and at least a part of the element X is arranged at a G site in the oxide material of the second spinel structure.

19. The magnetoresistive effect element according to claim 5,
wherein at least a part of the oxide material of the second spinel structure of the first interface region has a disordered spinel structure.

20. The magnetoresistive effect element according to claim 5,
wherein at least a part of the oxide material of the second spinel structure of the first interface region has an ordered spinel structure, and at least a part of the element X is arranged at a G site in the oxide material of the second spinel structure.

21. The magnetoresistive effect element according to claim 1,
wherein L includes one or more elements selected from the group consisting of Zn, Cu, Cd, Li, Ni, Fe, Co, Mn, Cr, Hg and V, and
M includes one or more elements selected from the group consisting of Mg, Ga, In, Sc, Ti, V, Cr, Mn, Fe, Rh, Ir and Co.

* * * * *